(12) United States Patent
Wheland et al.

(10) Patent No.: US 6,770,404 B1
(45) Date of Patent: Aug. 3, 2004

(54) ULTRAVIOLET AND VACUUM ULTRAVIOLET TRANSPARENT POLYMER COMPOSITIONS AND THEIR USES

(75) Inventors: Robert Clayton Wheland, Wilimington, DE (US); Roger Harquail French, Wilmington, DE (US); Fredrick Claus Zumsteg, Jr., Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 171 days.

(21) Appl. No.: 10/111,442

(22) PCT Filed: Nov. 16, 2000

(86) PCT No.: PCT/US00/31560

§ 371 (c)(1),
(2), (4) Date: Apr. 24, 2002

(87) PCT Pub. No.: WO01/37043

PCT Pub. Date: May 25, 2001

Related U.S. Application Data

(60) Provisional application No. 60/166,037, filed on Nov. 17, 1999.

(51) Int. Cl.[7] .............................................. G02B 1/04
(52) U.S. Cl. .......................... 430/5; 526/253; 354/350
(58) Field of Search ......................... 526/253; 359/350; 430/5

(56) References Cited

U.S. PATENT DOCUMENTS

| | | | | |
|---|---|---|---|---|
| 5,000,547 A | * | 3/1991 | Squire ........................ 359/642 |
| 5,188,873 A | * | 2/1993 | Delannoy ................ 428/36.92 |
| 5,286,567 A | * | 2/1994 | Kubota et al. ............... 428/422 |
| 5,344,677 A | * | 9/1994 | Hong ........................... 428/14 |
| 5,502,132 A | * | 3/1996 | Sugiyama et al. .......... 526/247 |
| 5,614,287 A | * | 3/1997 | Sekiya et al. ............... 428/163 |
| 6,335,408 B1 | * | 1/2002 | Russo et al. ................. 526/253 |

FOREIGN PATENT DOCUMENTS

| | | |
|---|---|---|
| EP | 416 528 | 9/1990 |
| EP | 0416528 A2 * | 3/1991 |
| JP | 5948766 | 3/1984 |
| JP | 1241557 | 9/1989 |
| JP | 7295207 | 11/1995 |
| WO | WO 9822851 | 5/1998 |
| WO | WO 9836324 | 8/1998 |

* cited by examiner

*Primary Examiner*—David W. Wu
*Assistant Examiner*—Henry S. Hu

(57) ABSTRACT

Disclosed are partially fluorinated and fully fluorinated polymers that are substantially transparent to ultraviolet radiation at wavelengths from 187 to 260 nanometers.

28 Claims, 19 Drawing Sheets

ULTRAVIOLET AND VACUUM ULTRAVIOLET TRANSPARENT POLYMER COMPOSITIONS AND THEIR USES

This application claims the benefit of Provisional Application No. 60/166,037, filed Nov. 17, 1999.

FIELD OF THE INVENTION

This invention concerns partially fluorinated and fully fluorinated polymers that are substantially transparent to ultraviolet radiation at wavelengths from approximately 187 nanometer to 260 nanometers.

TECHNICAL BACKGROUND OF THE INVENTION

The semiconductor industry is the foundation of the trillion dollar electronics industry. The semiconductor industry continues to meet the demands of Moore's law, whereby integrated circuit density doubles every 18 months, in large part because of continuous improvement of optical lithography's ability to print smaller features on silicon. The circuit pattern is contained in the photomask, and an optical stepper is used to project this mask pattern into the photoresist layer on the silicon wafer. Current lithography is done using 248 nm light; lithography with 193 nm light is just entering early production. Alternate methods of lithography that do not use visible or ultraviolet light waves, i.e., the next generation lithographies utilizing X-rays, e-beams or EUV radiation have not matured sufficiently that they are ready to be adopted for production. As use of this new technology develops, there remains a continuing need for improved materials with higher transparencies and greater resistance to radiation damage.

Certain fluoropolymers have already been identified in the art as useful for optical applications such as light guides, anti-reflective coatings and layers, pellicles, and glues. Most of this work has been done at wavelengths above 200 nm where perfluoropolymer absorption is of little concern.

WO 9836324, Aug. 20, 1998, Mitsui Chemical Inc., discloses the use of resins consisting solely of C and F, optionally in combination with silicone polymers having siloxane backbones, as pellicle membranes having an absorbance/micrometer of 0.1 to 1.0 at UV wavelengths from 140 to 200 nm. Data in the literature, together with applicant's measurements, for fluoropolymers (see Table 1 below) demonstrate that, at least at 157 nm, C and F fluoropolymers have absorbances much larger than $A/\mu=0.1$ to 1 as claimed by WO 9836324.

WO 9822851, May 28, 1998, Mitsui Chemicals, Inc., claims the use of photodegradation-resistant, tacky polymers that immobilize dust particles when coated on the inside of a pellicle frame. These tacky materials have compositions consisting largely of low molecular weight —($CF_2$—CXR) copolymers in which X is halogen and R is —Cl or —$CF_3$. Higher molecular weight polymers such as poly (perfluorobutenyl viny ether), poly[(tetrafluoroethylene/4,5-difluoro-2,2-bis(trifluoromethyl)-1,3-dioxole)], poly (tetrafluoroethylene/hexafluoropropylene/vinylidene fluoride), poly(hexafluoropropylene/vinylidene fluoride), or poly(chlorotolyl fluoroethylene/vinylidene fluoride) are added as a minor component to improve creep resistance. It should be noted that all exemplifications of this technology were with poly(chlorotrifluoroethylene) as the low molecular weight adhesive agent and that retention of tackiness after extended UV degradation (illustrated only at 248 nm), not transparency, was the only demonstrated advantage of the claimed formulations.

Japanese Patent 07295207, Nov. 10, 1995, Shinetsu Chem. Ind Co, claims double layer pellicles combining Cytop CTXS (poly($CF_2$=$CFOCF_2CF_2CF$=$CF_2$)) with Teflon® AF 1600 for greater strength.

U.S. Pat. No. 5,286,567, Feb. 15, 1994, Shin-Etsu Chemical Co., Ltd., claims the use of copolymers of tetrafluoroethylene and five membered cyclic perfluoroether monomers as pellicles once they have been made hydrophilic, and therefore antistatic, by plasma treatment.

European Patent 416528, Mar. 13, 1991, DuPont, claims amorphous fluoropolymers having a refractive index of 1.24–1.41 as pellicles at wavelengths of 190–820 nm. Copolymers of perfluoro(2,2-dimethyl-1,3-dioxole) with tetrafluoroethylene, chlorotrifluoroethylene, vinylidene fluoride, hexafluoropropylene, trifluoroethylene, vinyl fluoride, (perfluoroalkyl)ethylenes, and perfluoro(alkyl vinyl ethers) are cited.

Japanese Patent 01241557, Bando Chemical Industries, Ltd., Sep. 26, 1989, claims pellicles usable at 280–360 nm using (co)polymers of vinylidene fluoride ($VF_2$,), tetrafluoroethylene/hexafluoropropylene (TFE/HFP), ethylene/tetrafluoroethylene (E/TFE), TFE/$CF_2$=CFORf, TFE/HFP/$CF_2$=CFORf, chlorotrifluoroethylene (CTFE), E/CTFE, CTFE/$VF_2$ and vinyl fluoride (VF).

Japanese Patent 59048766, Mar. 21, 1984, Mitsui Toatsu Chemicals, Inc., claims the use of a stretched film of poly(vinylidene fluoride) as having good transparency from 200 to 400 nm.

Many of the fluoropolymers cited in the references above are noticeably hazy to the eye because of crystallinity and would therefore be expected to scatter light to a degree unsuitable for high light transmission and the accurate reproduction of circuit patterns. Poly(vinylidene fluoride), poly(chlorotrifluoroethylene), poly(tetrafluoroethylene/ ethylene), commercially available poly(tetrafluoroethylene/ hexafluoropropylene) compositions, and poly(ethylene/ chlorotrifluoroethylene) are all such crystalline, optically hazy materials. More recent references have thus been directed at Cytop™ and Teflon® AF because they combine perfluorination with outstanding optical clarity, solubility, and a complete lack of crystallinity. Cytop™ and Teflon™ are less than ideal, however, because the difficulty of the their monomer syntheses make them extremely expensive.

It is an object of the present invention to overcome the difficulties associated with the prior art by providing partially fluorinated and fully fluorinated polymers that are substantially transparent to ultraviolet radiation at wavelengths between 187 and 260 nanometers, especially at 193 nanometers and/or 248 nanometers.

SUMMARY OF THE INVENTION

This invention provides An ultraviolet transparent material exhibiting an absorbance/micron (A/micrometer) $\leq 1$ at wavelengths from 187–260 nm comprising amorphous vinyl copolymers of $CX_2$=$CY_2$, wherein X is —F or —$CF_3$ and Y is H and 0 to 25 mole % of one or more monomers $CR^aR^b$=$CR^cR^d$ where the $CR^aR^b$=$CR^cR^d$ enters the copolymer in approximately random fashion, or 40 to 60 mole % of one or more monomers $CR^aR^b$=$CR^cR^d$ in the case where the $CR^aR^b$=$CR^cR^d$ enters the copolymer in approximately alternating fashion where each of $R^a$, $R^b$, and $R^c$ is selected independently from H or F and where $R^d$ is selected from the group consisting of —F, —$CF_3$, —$OR_f$ where $R_f$ is $C_nF_{2n+1}$ with n=1 to 3, —OH (when $R^c$=H), and Cl (when $R^a$, $R^b$, and $R^c$=F). Another useful embodiment within the present wavelength range is 187 to 199 nm.

This invention also provides an ultraviolet transparent material exhibiting an absorbance/micron (A/micrometer) ≦1 at wavelengths from 187–260 nm comprising amorphous vinyl copolymers of $CH_2=CHCF_3$ and $CF_2=CF_2$; $CH_2=CFH$ and $CF_2=CFCl$; $CH_2=CHF$ and $CClH=CF_2$, wherein the ratio of monomers ranges from approximately 1:2 to approximately 2:1; perfluoro(2-methylene-4-methyl-1,3-dioxolane) and perfluoro(2,2-dimethyl-1,3-dioxole); perfluoro(2-methylene-4-methyl-1,3-dioxolane) and vinylidene fluoride in any ratio that gives an amorphous composition; perfluoro(2-methylene-4-methyl-1,3-dioxolane) with tetrafluoroethylene in any ratio that gives an amorphous composition; and the homopolymer of perfluoro (2-methylene-4-methyl-1,3-dioxolane).

This invention further provides pellicles, anti-reflective coatings, optically clear glues, light guides and resists comprising the UV transparent material provided above.

This invention further provides copolymer compositions comprising poly(hexafluoroisobutylene:trifluoroethylene) with 40–60 mole % hexafluoroisobutylene and 60–40 mole % trifluoroethylene and copolymer compositions comprising poly(hexafluoroisobutylene:vinyl fluoride) with 40–60 mole % hexafluoroisobutylene and 60–40 mole % vinyl fluoride.

(Sample 27), 1:1 HFIB:VA (Sample 32), PMD (Sample 33) and PMD:PDD (Solution 34) versus wavelength lambda (λ) in units of nanometers.

Figure 18:
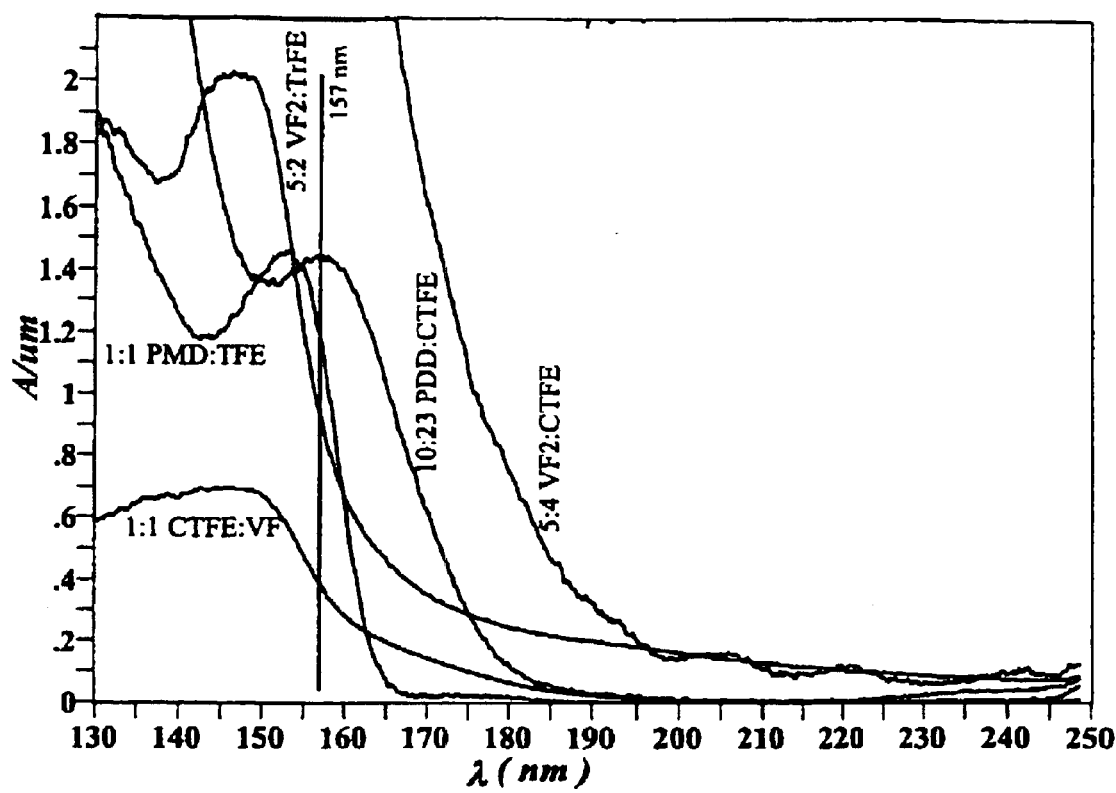

FIG. 18 describes the absorbance in units of inverse microns for 1:1 CTFE:VF (Sample 6b), 5:2 VF2:TrFE (Sample 10), 10:23 PDD:CTFE (Sample 11), 5:4 VF2:CTFE (Sample 15) and 1:1 PMD:TFE (Sample 18) versus wavelength lambda (λ) in units of nanometers.

Figure 19:
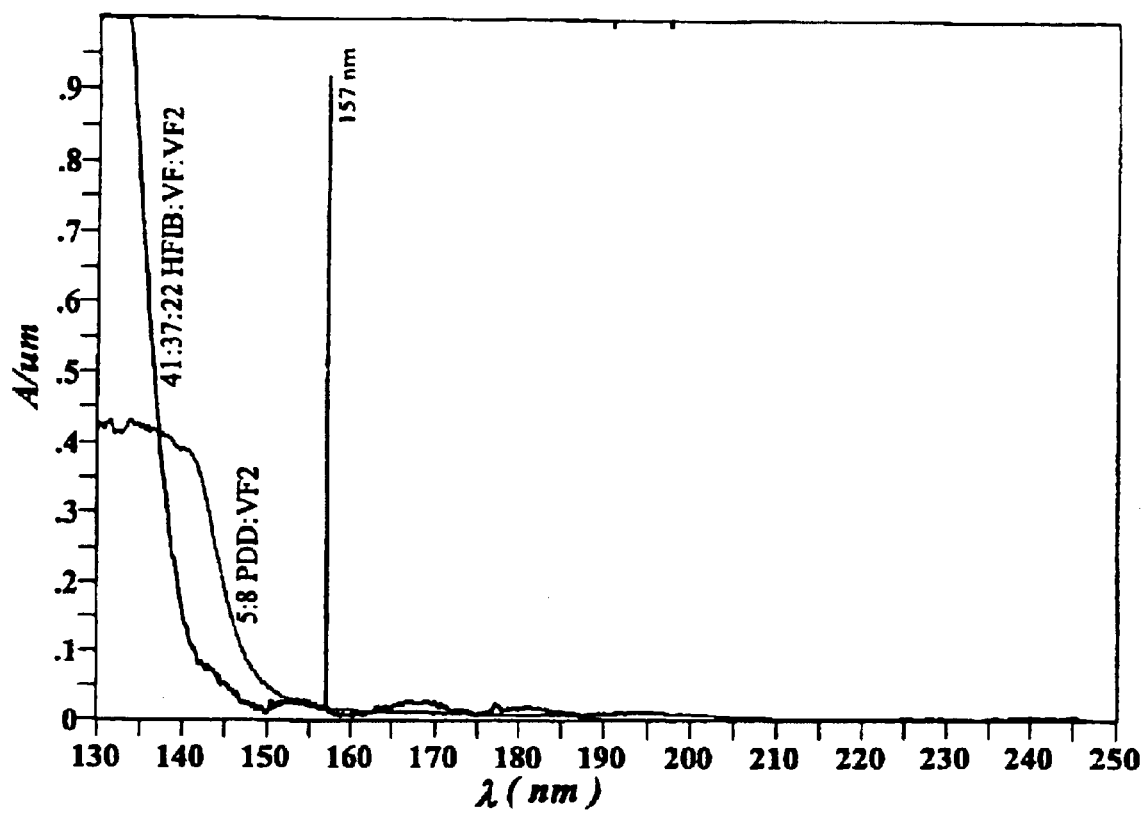

FIG. 19 describes the absorbance in units of inverse microns for 5:8 PDD:VF2 (Sample 29) and 41;37:22 HFIB-:VF:VF2 (Sample 19) versus wavelength lambda (λ) in units of nanometers.

DETAILED DESCRIPTION OF THE INVENTION

The invention provides fluoropolymer compositions and their use in certain electronic applications.

Certain abbreviations used throughout the specification are tabulated:

| | |
|---|---|
| TFE | tetrafluoroethylene |
| HFP | hexafluoropropylene |
| VF | vinylfluoride |
| CTFE | chlorotrifluoroethylene |
| $VF_2$ | vinylidene fluoride |
| HFIB | hexafluoroisobutylene |
| TrFE | trifluoroethylene |
| PDD | 4,5-difluoro-2,2-bis(trifluoromethyl)-1,3-dioxole |
| PMD | Perfluoro(2-methylene-4-methyl-1,3-dioxolane) |
| Teflon ® AF 2400 | 89:11 PDD:TFE |
| Teflon ® AF 1601 | 68:32 PDD:TFE |
| Teflon ® AF 1200 | 48:52 PDD:TFE |
| ClDFE | 1-chloro-2,2-difluoroethylene |
| PPVE | perfluoro(propyl vinyl ether) |
| PMVE | perfluoro(methyl vinyl ether) |
| VOAc | vinyl acetate |
| VOH | vinyl alcohol |
| TrP | 3,3,3-trifluoropropene |
| Fluorinert ® FC-75 | Electronic fluid manufactured by 3M, believed to approximate perfluoro(butyl tetrahydrofuran) |
| Fluorinert ® FC-40 | Electronic fluid manufactured by 3M, believed to approximate perfluoro(tributylamine) |
| Vazo ® 56 WSP | Initiator manufactured by DuPont, 2,2'-bis(2-amidino-propane)dihydrochloride |
| DSC | Differential scanning calorimetry |

Perfluoro-(2,2-dimethyl-1,3-dioxole) and perfluorodimethyldioxole are terms commonly used in the art as variant designations of 4,5-difluoro-2,2-bis(trifluoromethyl)-1,3-dioxole, the abbreviation of which is widely known as PDD, as noted above.

Absorption maxima for selected hydrocarbon and fluorocarbon compounds are shown in Table 1.

TABLE 1

Comparison of UV Absorption Maxima for Hydrocarbons and Fluorocarbons

| | WAVELENGTH OF ABSORPTION MAXIMUM | |
|---|---|---|
| | $C_nH_{2n+2}$[1] | $C_nF_{2n+2}$ |
| n = 1 | 143 nm & 128 nm | |
| n = 2 | 158 nm & 132 nm | |
| n = 3 | 159 nm & 140 nm | 119 nm[1] |
| n = 4 | 160 nm & 141 nm | 126 nm[1] |
| n = 5 | 161 nm & 142 nm | 135 nm[1] |
| n = 6 | 162 nm & 143 nm | 142 nm[1] |
| n = 7 | 163 nm & 143 nm | |
| n = 8 | 163 nm & 142 nm | |
| n = 172 | | 161 nm[2] |

[1]B. A. Lombos, P. Sauvageau, and C. Sandorfy, Chem, Phys. Lett., 1967, 42.
[2]K. Seki, H. Tanaka, T. Ohta, Y. Aoki, A, Imamura, H. Fujimoto, H. Yamamoto, H. Inokuchi, Phys. Scripta, 41, 167(1990).

As can be seen from the table, UV absorption maxima move to longer wavelengths as chain length increases for both hydrocarbons and fluorocarbons. Fluorocarbon chains $(CF_2)n$ absorb at 157 nm somewhere between n=6 (142 nm) and n=172 (161 nm) while hydrocarbon chains $(CH_2)n$ absorb at 157 nm as early as n=2. Clearly then fluorocarbon chains are more resistant than hydrocarbon chains to UV absorption and not surprisingly the industry has been moving increasingly towards perfluorination when seeking high UV transmission. But, as long as chain lengths still offering acceptable transparency can never exceed $(CH_2)_1$ or $(CF_2)_6$, perfectly transparent polymers at 157 nm and somewhat longer wavelengths would seem precluded. Consistent with this, V. N. Vasilets, et al., *J. Poly. Sci, Part A, Poly. Chem.*, 36, 2215(1998) for example report that poly (tetrafluoroethylene/hexafluoropropylene), [poly(TFE/HFP)], (Teflon® FEP), shows strong absorption and photochemical degradation at 147 nm. Similarly we find that 1:1 poly(hexafluoropropylene:tetrafluoroethylene) is highly absorbing at 157 mm (Table 2, A/micron=3.6@157 nm).

Polymers play a critical role in lithography in multiple areas: one is the polymer pellicle which is placed over the mask pattern to keep any particulate contaminants out of the photomask object plane, thereby ensuring that the lithographic imaging will be defect free. The pellicle is a free standing polymer membrane, typically 0.8 micrometers in thickness, which is mounted on a typically 5 inch square frame. The pellicle film must have high transparency or transmission of light at the lithographic wavelength for efficient image formation and must neither darken nor burst with prolonged illumination in the optical stepper. Pellicles for current lithographic wavelengths utilize pellicles with >99% transmission, through exploitation of polymers with very low optical absorption combined with thin film interference effects. Typically the electronics industry likes to see greater than 98% transparency over an exposure lifetime of 75 million laser pulses of 0.1 $mJ/cm^2$, or a radiation dose of 7.5 kJ.

A pellicle transmission of 98% corresponds to an absorbance A of approximately 0.01 per micrometer of film thickness. The absorbance is defined in Equation 1, where the Absorbance A per micron of film thickness, is defined as the base 10 logarithm of the ratio of the substrate transmission divided by the transmission of the Sample consisting of the polymer film sample on its substrate, this quantity divided by the polymer film thickness.

$$A_{film}(\mu m^{-1}) = A/um = \frac{\text{Log}_{10}[T_{substrate}/T_{sample}]}{t_{film}}. \qquad \text{Equation 1}$$

In this manner the Absorbance A has units of inverse microns (or 1/micron, where a micron, is a micrometer or um of polymer film thickness. The absorbance/micron of polymer films discussed here were measured for polymer films spun coated on to $CaF_2$ substrates using standard methods. The VUV transmission of each $CaF_2$ substrate was measured prior to the spin coating of the polymer film. Then the VUV transmission of the polymer film on that particular $CaF_2$ substrate was measured, and using the measured film thickness (reported in Table 2) and equation 1, the values of the absorbance/micron for the polymers, as a function of wavelength was determined, and the value of the absorbance/micron for a wavelengths of 157, 193, and 248 nm is tabulated in Table 2. For some materials, two films, of differing thicknesses are presented in the Table 2, and Absorbance/micron values for each film are also presented.

The VUV transmission of the $CaF_2$ substrates and the polymer films on the $CaF_2$ substrates were measured using a VUV spectrophotometer using a laser plasma light source, a sample chamber capable of both transmission and reflectance measurements, a 1 meter monochromator and a sodium salicylate phosphor coated 1024 element photodiode detector. This is discussed in greater detail in R. H. French, "Laser-Plasma Sourced, Temperature Dependent VUV Spectrophotometer Using Dispersive Analysis", Physica Scripta, 41, 4, 404–8, (1990) which is incorporated herein by reference.

Figure 1:
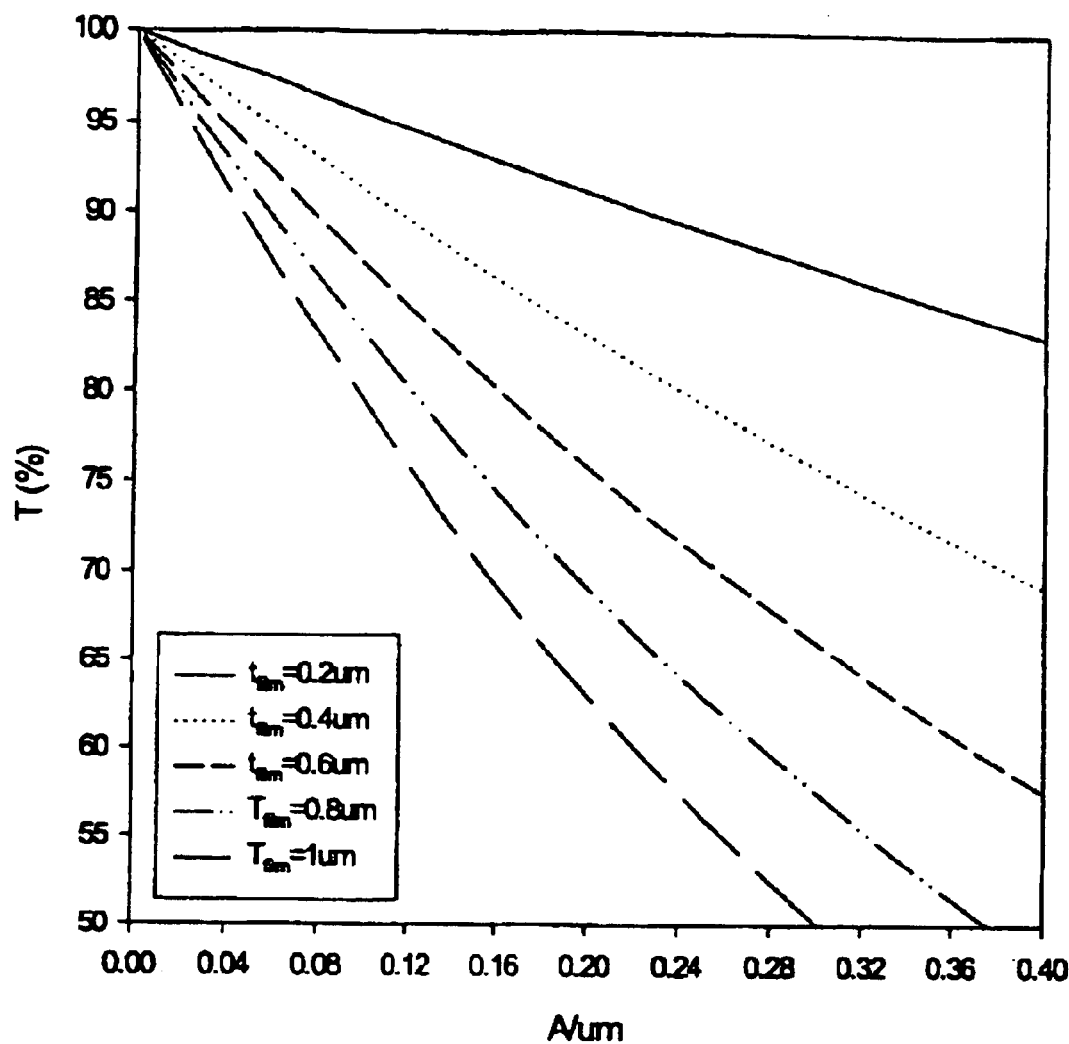
FIG. 1 describes the 157 nm transmission T of a pellicle in units of % as a function of the 157 nm absorbance, in units of inverse microns, of the polymer for an absorbance range from 0.4 to 0.0. The effects of thin film interference in the pellicle membrane are neglected in this calculation.

The absorbance per micron of a polymer will determine the average transmission of an unsupported pellicle film made from that polymer. In FIG. 1, the 157 nm transmission T of a pellicle in units of % as a function of the 157 nm absorbance, in units of inverse microns, of the polymer for an absorbance range from 0.4 to 0.0 is shown. The effects of thin film interference in the pellicle membrane are neglected in this calculation. The results for pellicle films of thicknesses ranging from 0.2 microns to 1 micron are shown, and demonstrate that for any particular polymer, the pellicle transmission can be increased, through the use of a thinner pellicle film thickness. This approach to increasing the pellicle transmission has a limited range of utility, since the pellicle film is an unsupported polymer membrane and must have sufficient mechanical strength and integrity. These mechanical requirements suggest the use of polymer with relatively high glass transition temperature $T_g$ and polymer film thicknesses of 0.6 microns or greater. From FIG. 1 it can be seen that a target absorbance per micron of a polymer for pellicle applications is <0.02 abs./micron at 157 nm.

Figure 2:
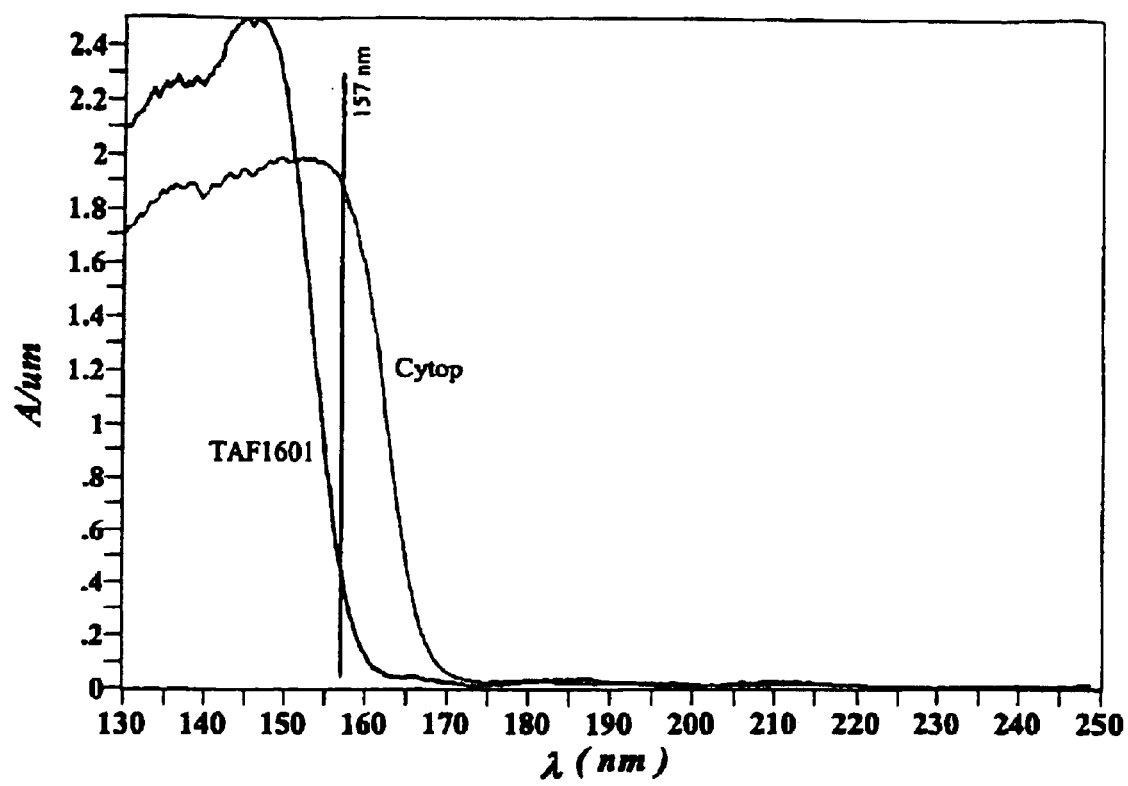
FIG. 2 describes the absorbance in units of inverse microns for Teflon® AF 1601 (Sample 7a) and Cytop™ (Sample 13) versus wavelength lambda ($\lambda$) in units of nanometers.

In FIG. 2 the absorbance in units of inverse microns for Teflon® AF 1601 and Cytop™ versus wavelength lambda ($\lambda$) in units of nanometers is shown. At 157 nanometers, the absorbance/micron for Cytop has a value of 1.9/micron while Teflon® AF 1601 has an absorbance of 0.42/micron, approximately 5 times lower than Cytop. In Example 1 we will demonstrate that even the 157 nm absorbance of Teflon® AF 1601 of 0.42/micron is too high for application as a pellicle for use at 157 nm.

The optical properties (index of refraction, "n" and extinction coefficient, "k") are determined from variable angle spectroscopic ellipsometry (VASE) at three incident angles covering the wavelength range from 186–800 nm, corresponding to an energy range of 1.5–6.65 eV, in combination with VUV ellipsometry (VUV-VASE) measurements performed at a single angle of incidence from 143–275 nm, corresponding to an energy range of 4.5–8.67 eV. The polymer films were spin coated onto a silicon substrate. The VASE ellipsometers were manufactured by J. A. Woollam Company, 645 M Street, Suite 102, Lincoln, Nebr. 68508 USA. Optical constants were fit to these data simultaneously, using an optical model of the film on the substrate. See generally, O. S. Heavens, Optical Properties of Thin Solid Films, pp. 55–62, Dover, N.Y., 1991, incorporated herein by reference.

From knowledge of the spectral dependence of optical properties, the transmission of a pellicle film of arbitrary thickness can be calculated by using an optical model for the unsupported pellicle film, at a specific polymer film thickness, and then calculating the pellicle film transmission and reflectance. In this manner the pellicle film thickness can be optimized such that the pellicle will exhibit a thin film interference maximum in the transmission spectrum at the desired lithographic wavelength. These transmission maxima occur for various film thicknesses, determined from the index of refraction of the polymer, the lithographic wavelength of interest and the film thickness. The transmission maxima of a properly tuned etalon pellicle film occur where the reflectance of the pellicle film exhibits minimum in the reflectance, and correspond to minimizing the pellicle's reflectance and maximizing its transmission at the lithographic wavelength. The relationship between the extinction coefficient k and the absorption coefficient a and the absorbance per micron A is given in Equation 2, where lambda is the wavelength of light. This relationship is useful in comparing results of absorbance measurements and ellipsometry measurements. This relationship for A is exact if light scattering in the polymer film (as may occur due to crystallinity of the polymer), thin film interference effects, and surface scattering effects are minimized.

$$k = \frac{\alpha\lambda}{4\pi} = 2.3\frac{A\lambda}{4\pi}. \qquad \text{Equation 2}$$

Polymeric materials with very low absorbance/micron or extinction coefficients and low values of the index of refraction also have very important applications as anti-reflection coatings and optical adhesives. A low absorbance material, as taught here in can be used to reduce the light reflected from the surface of a transparent substrate of a relatively higher index of refraction. This decrease in the reflected light, leads to a concomitant increase in the light transmitted through the transparent substrate material. This anti reflective coating effect of these low absorbance/micron materials can be seen in the results for $VF_2$:PDD, $VF_2$:HFP, HFIB:TrFE, and HFIB:VF where the absorbance of the polymers on $CaF_2$ substrates for the case of very thin films, exhibits negative absorbance/micron. This corresponds to an increase of 157 nm light transmission through the polymer film on the $CaF_2$ substrate as compared to the light transmission through the bare $CaF_2$ substrate. For $VF_2$:HFP, HFIB:TrFE and HFIB:VF we have measured much thicker polymer films (also listed in Table 2) in which this antireflective coating effect is not seen, where the absorbance/micron of the polymers is seen to be positive and very small.

Polymers such as these can also be used as adhesives to join optical elements together, and since they have low optical absorbance/micron and low values of the index of refraction, they serve to reduce the reflectance of light at the air/substrate interfaces among the optical elements, and serve to direct more of the transmitted light from one optical element into subsequent optical elements in the system.

The materials of the present invention are useful in the manufacture of transmissive optical elements, such as lenses and beam splitters, for use in the vacuum UV region.

These materials may also be used as elements in a compound lens designed to reduce chromatic aberrations. At present only $CaF_2$ and possibly hydroxyl free silica are viewed as having sufficient transparency at 157 nm to be used in transmissive focussing elements. It is also commonly known (e.g., see R. Kingslake, Academic Press, Inc., 1978, Lens Design Fundamentals, p. 77) that by using a second material of different refractive index and dispersion, an achromatic lens can be created. A Sellmeier fit to the data shown in FIG. 10 for HFIB:VF as described in Example 4 shows it to have a refractive index of 1.4942 and a dispersion of 0.00220 $nm^{-1}$ at 157 nm. A similar fit to the index of refraction data for $CaF_2$ from Edward D. Palik, Handbook of Optical Constants of Solids II, p. 831, Academic Press, Inc., Boston, Mass. (1991) and French shows it to have an index 1.5584 and a dispersion of 0.00234 $nm^{-1}$ at 157 nm. Thus, by using one of these materials in conjunction with $CaF_2$, it is expected that an achromatic lens can be constructed from this and other similar materials described in this application.

An additional area in which polymers play a critical role is as the photosensitive photoresist which captures the optical latent image. In the case of photoresists, light must penetrate the full thickness of the resist layer for a latent optical image, with well defined vertical side walls to be produced during optical imaging which then will produce the desired resist image in the developed polymer. When used as a resist at 157 nm, a polymer can have a considerably higher absorption coefficient of A<~2–3 per micrometer of film thickness, if the resist thickness is limited to about 2000 Å.

WO 9836324 discloses carbon/fluorine polymers such as poly(tetrafluoroethylene/hexafluoropropylene) as pellicle membranes having absorption $A/\mu$ of 0.1 to 1 for use at 140 to 200 nm. The data in Table 1 above, derived from literature sources, Vasilets' report of high absorption and photodegradation of poly(hexafluoropropylene/tetrafluoroethylene) at 148 nm [V. N. Vasilets, et al, *J. Poly. Sci., Part A, Poly. Chem.*, 36, 2215 (1998), and the data in Table 2 which combines additional literature data with applicant's data, casts doubt on this disclosure. For example, poly (tetrafluoroethylene:hexafluoropropylene), polymer 14 of Table 2, shows a relatively strong $A/\mu$ of 3.9 at 157 nm that fails not only the industry goals for pellicles ($A/\mu$ <0.01) but also the much looser goals for resists ($A/\mu$ <2–3). Japanese Patent 072952076 claims bilayer membranes of Cytop™ and Teflon® AF 1600 as pellicle films. At 157 nm Cytop™ has an $A/\mu$ of 1.9 (polymer 13, Table 2) and Teflon® AF 1600 an $A/\mu$ of 0.4 (polymer 7, Table 2). This is not surprising considering the data of Table 1 that shows significant UV light absorption at 160 nm whenever there are more than about 6 $CF_2$ groups connected in a chain. Indeed, W. H. Buck and P. R. Resnick report that Teflon™ AF 1600 has more than 30% of its $CF_2$ units present as $(CF_2)n$ runs with n>6 consistent with its $A/\mu$=0.4 [J. Scheirs, Modern Fluoropolymers, John Wiley, New York, 1997, Chapter 22, page 401]. Unless the interactions responsible for such absorption can be broken up, it would seem impossible to find a carbon based polymer completely transparent at wavelengths shorter than about 160 nm.

Table 2 below lists absorbance/micrometer ($A/\mu$) at 157, 193, and 248 nm for partially and fully fluorinated polymer films that have been spin coated on $CaF_2$ crystals. Polymers are listed in order of increasing absorption. In some cases, more than one sample of various polymers have been prepared within an Example. Therefore, Table entries are identified by both Example number (first column) and sample number. In addition, reference to Figures displaying spectra of various polymers are cross referenced in the Table.

TABLE 2

Absorbance per micron ($A/\mu m$) for Selected Fluoropolymers

Figure 7:
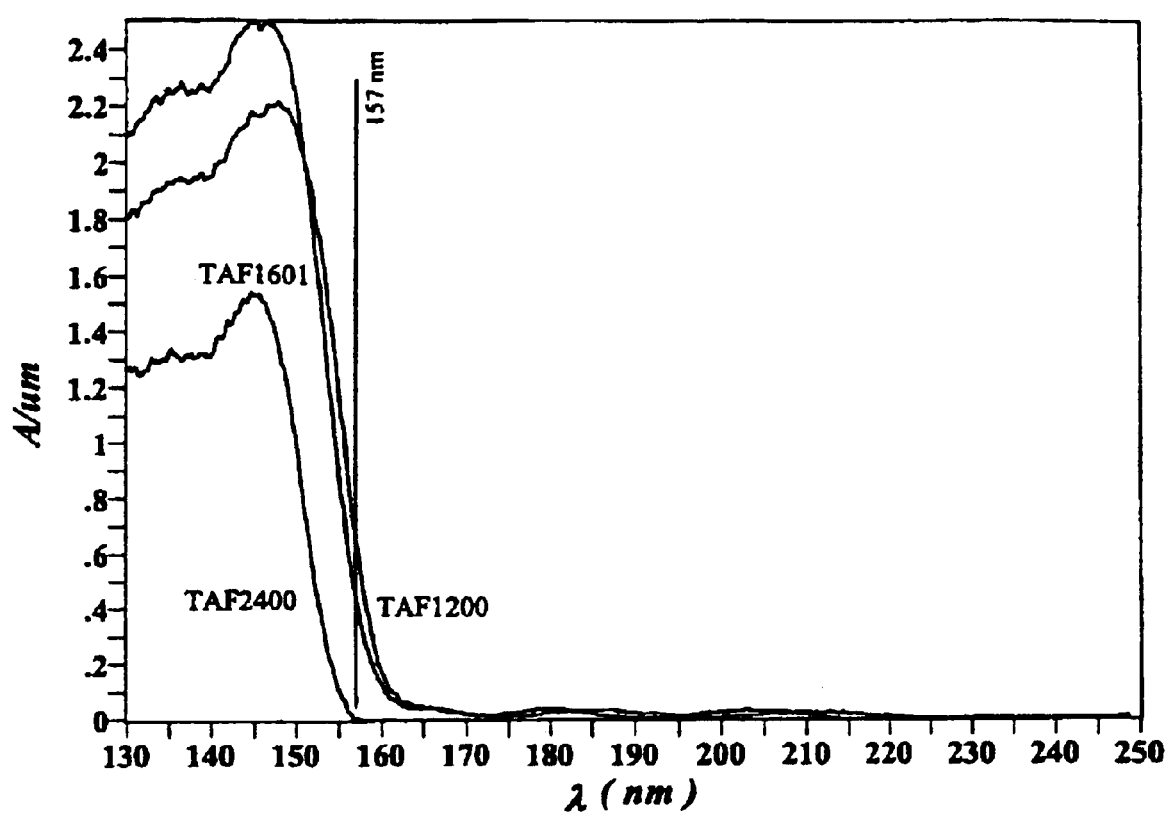
FIG. 7 describes the absorbance in units of inverse microns for Teflon® AF 1200 (Sample 8), Teflon® AF 1601 (Sample 7a), and Teflon® AF 2400 (Sample_5)_versus wavelength lambda ($\lambda$) in units of nanometers. Notice the dramatic decrease in the absorbance/micron as the PDD content of the polymer increases and the TFE content of the polymer decreases from 52% to 32% to 11%, and therefore the lengths of any $(CF_2)_n$ runs in the polymer decreases.
Figure 9:
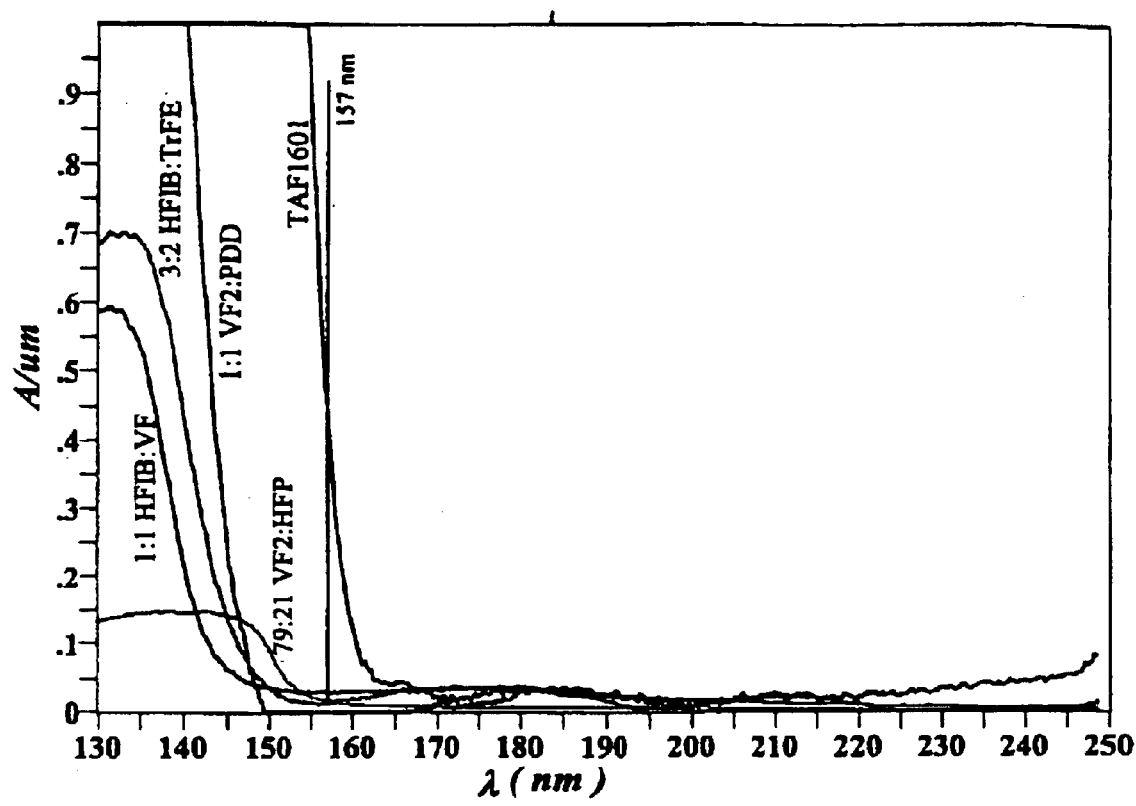
FIG. 9 describes the absorbance in units of inverse microns for $VF_2$:PDD (Sample 2), $VF_2$:HFP (Sample 1), HFIB:TrFE (Sample 3) and HFIB:VF (Sample 4) versus wavelength lambda ($\lambda$) in units of nanometers.
Figure 10:
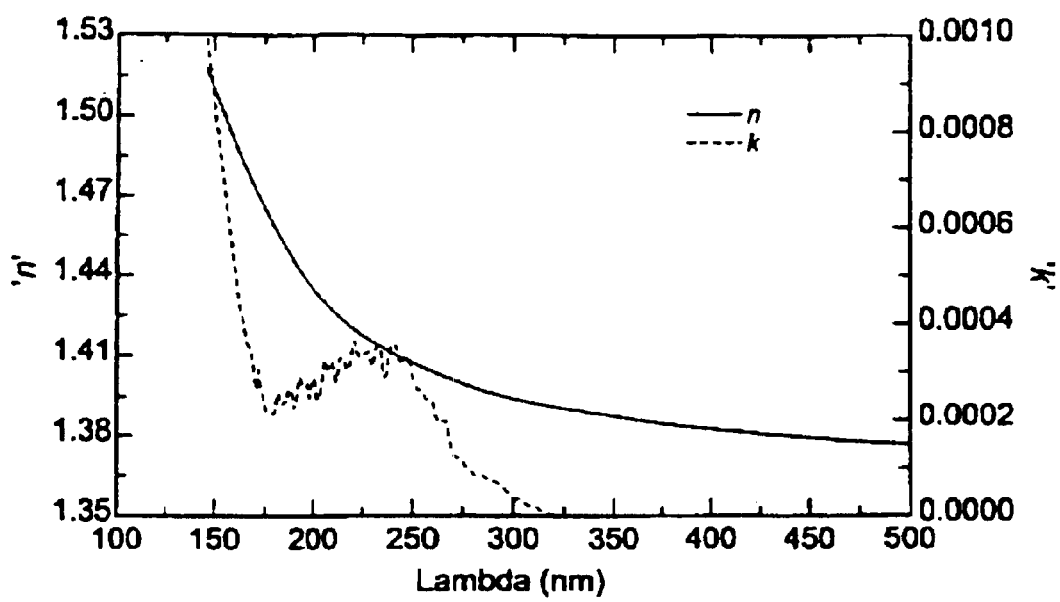
FIG. 10 describes the index of refraction n and the extinction coefficient k determined for a HFIB:VF film (Sample 4a) of thickness 14,386 angstroms on a silicon substrate versus wavelength lambda in units of nanometers determined by VUV spectroscopic ellipsometry.

| Figure #, Example # | Sample # | Structure Name | $A/\mu m$ 157 nm | $A/\mu m$ 193 nm | $A/\mu m$ 248 nm | Tg | Tm | Thick Angstroms | Spin Speed Rpm |
|---|---|---|---|---|---|---|---|---|---|
| FIG. 9 | 1a | 79:21 | 0.015 | 0.005 | 0.003 | −22° C. | | 69,800 | 3 k |
| Ex. 5 | 1b | $CF_2$=$CH_2$:$CF_2$=$CFCF_3$ 79:21 VF2:HFP | (−0.3) | (−0.15) | (−0.1) | | | (1641) | 6 k |
| FIG. 9 | 2 | 1:1 $CF_2$=$CH_2$:$PDD^2$ 1:1 VF2:PDD | −0.04 | 0.02 | 0.08 | $ND^7$ | | 2097 | 6 k |
| FIG. 9 | 3a | 3:2 $(CF_3)_2$=C | 0.012 | 0.005 | −0.001 | 93° C. | | 12146 | 3 k |
| Ex. 2 | 3b | =$CH_2$:$CF_2$=CFH 3:2 HFIB:TrFE | (−0.05) | (0.03) | (0.01) | | | (1500) | 6 k |
| FIG. 9 | 4a | 3:2 | 0.027 | 0.020 | 0.008 | 56° C. | | 14386 | 3 k |
| | 4b | $(CF_3)_2$C=$CH_2$:$CH_2$=CFH | (−0.04) | (0.009) | (0.03) | | | (2870) | 6 k |
| FIG. 10 Ex. 3 | 4c | 3:2 HFIB:VF | 0.022 | | | | | | |
| FIG. 7 | 5 | 89:11[4] $PDD^2$:$CF_2$=$CF_2$ TAF2400 PDD:TFE | 0.007 | −0.06 | −0.06 | 240° C. | | 2133 | 6 k |
| FIG. 18 | 6a | 1:1 | 0.129 | −0.073 | −0.037 | | | 1850 | |
| Ex. 21 | 6b | $CF_2$=CFCl:CH2=CHF 1:1 CTFE:VF | (0.388) | (0.016) | (0.006) | | | (17644) | |
| FIG. 2,7 | 7a | 68:32[5] | 0.42 | 0.02 | 0.01 | 160° C. | | 3323 | 6 k |
| Ex. A, | 7b | $PDD^2$:$CF_2$=$CF_2$ TAF1601 PDD:TFE | (0.35[#]) | | | | | (2146) | |
| FIG. 7 Ex. | 8 | 48:52[6] $PDD^2$:$CF_2$=$CF_2$ TAF1200 PDD:TFE | 0.64 | 0.004 | −0.001 | 120° C. | | 4066 | 6 k |

TABLE 2-continued

Absorbance per micron (A/μm) for Selected Fluoropolymers

Figure 8:
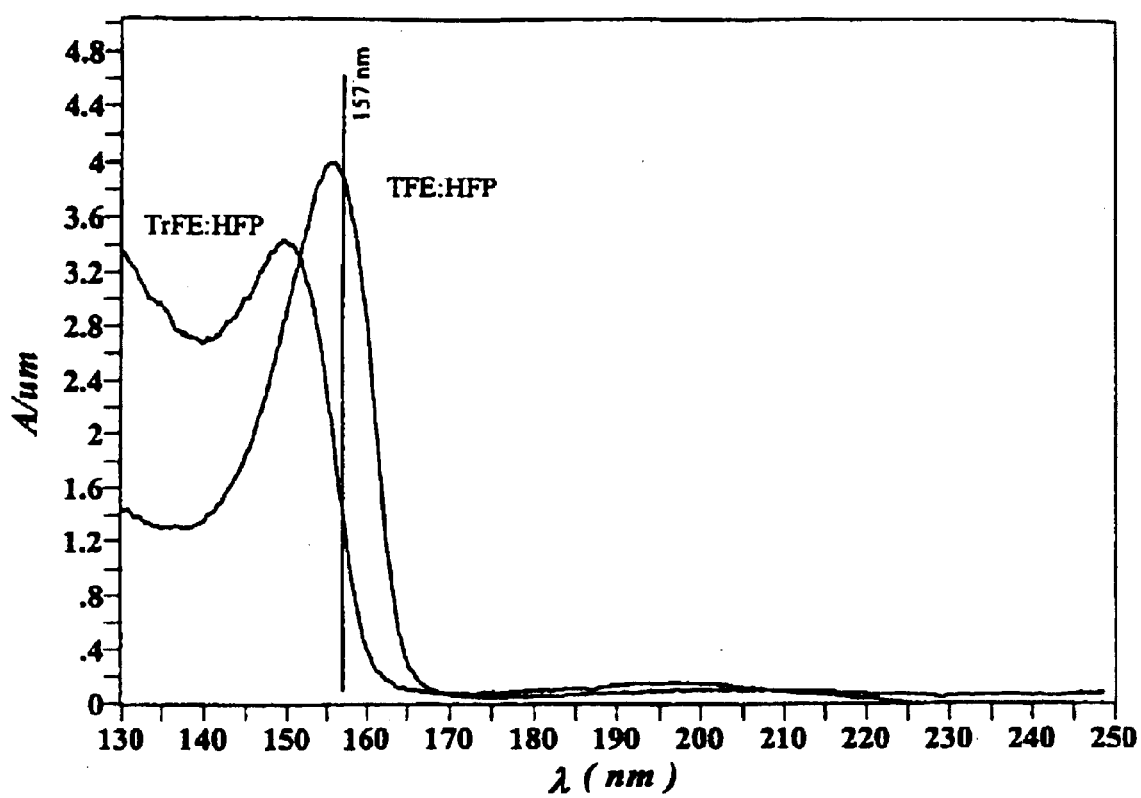
FIG. 8 describes the absorbance in units of inverse microns for TFE:HFP (Sample 14) and TrFE:HFP (Sample 12) versus wavelength lambda ($\lambda$) in units of nanometers. The presence of the HF carbons in the $CF_2=CFH$ monomer interrupts extended $CF_2$ runs. This effect can also be understood as the absorption maxima of TFE:HFP polymer shifts to shorter wavelengths in the TrFE:HFP polymer.
Figure 15:
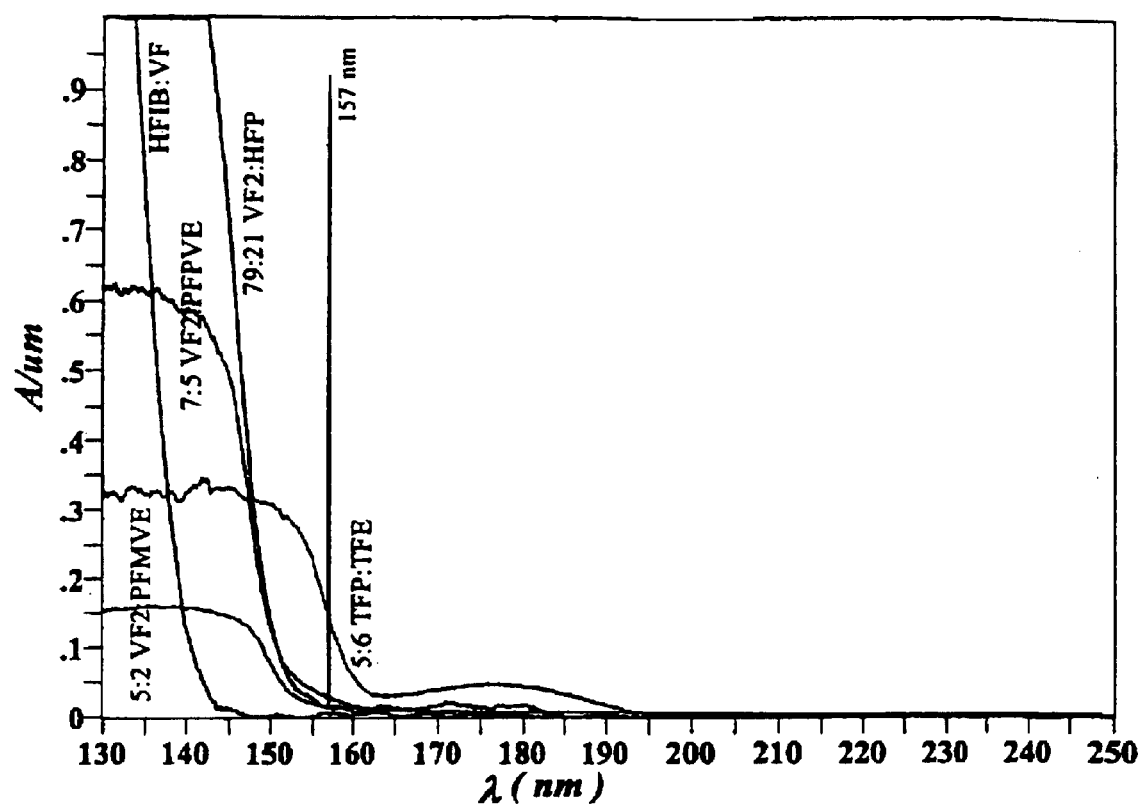
FIG. 15 describes the absorbance in units of inverse microns for 5:6 TFP:TFE (Sample 17), HFIB:VF (Sample 18), 5:2 VF2:PFMVE (Sample 19), 7:5 VF2:PFPVE (Sample 21) and 79:21 VF2:HFP (Sample 22) versus wavelength lambda ($\lambda$) in units of nanometers.
Figure 16:
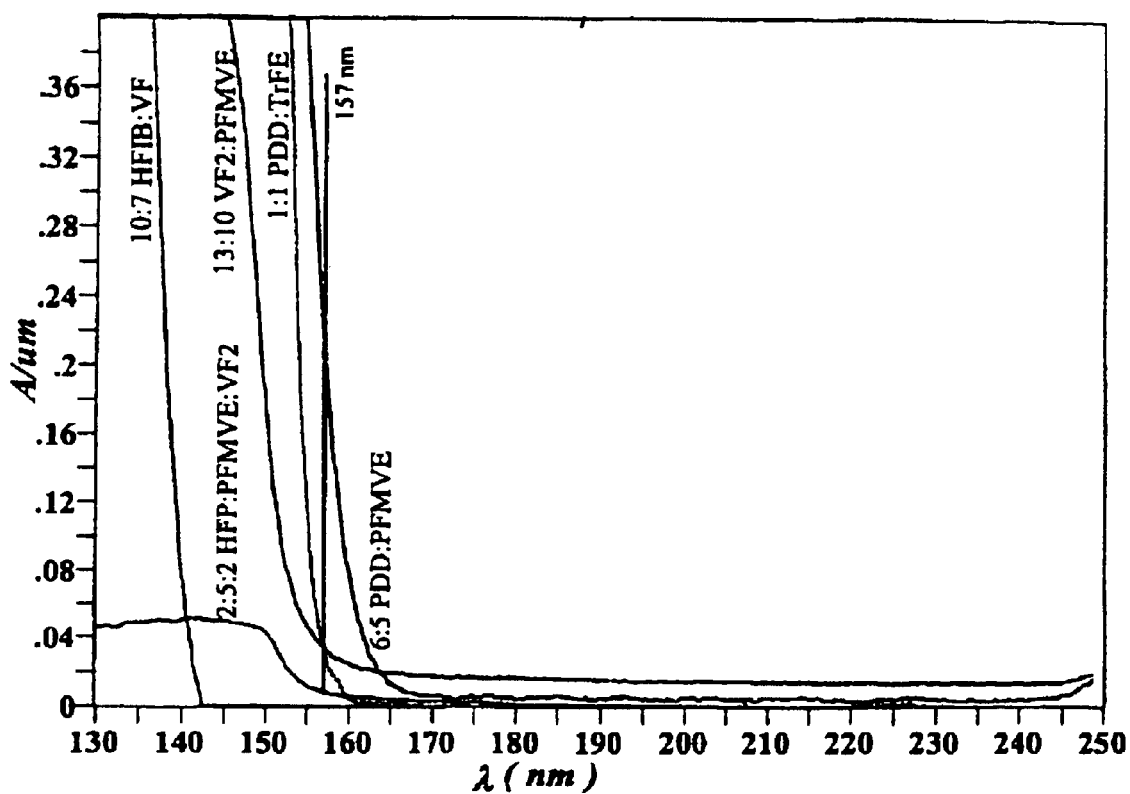
FIG. 16 describes the absorbance in units of inverse microns for 1:1 PDD:TrFE (Sample 9), 13:10 VF2:PFMVE (Sample 20), 2:5:2 HFP:PFMVE:VF2 (Sample 23), 10:7 HFIB:VF (Sample 24) and 6:5 PDD:PFMVE (Sample 25) versus wavelength lambda ($\lambda$) in units of nanometers, FIG. 17 describes the absorbance in units of inverse microns for 20:11 VF:ClDFE (Sample 26), 1:2 PDD:VF2

| Figure #, Example # | Sample # | Structure Name | A/μm 157 nm | A/μm 193 nm | A/μm 248 nm | Tg | Tm | Thick Angstroms | Spin Speed Rpm |
|---|---|---|---|---|---|---|---|---|---|
| FIG. 16 | 9 | 1:1 PDD[2]:CF$_2$=CFH 1:1 PDD:TrFE | 0.03 | −0.004 | −0.001 | 150° C. | | 7688 | |
| FIG. 18 | 10 | 5:2 CH$_2$=CF$_2$:CF$_2$=CFH 5:2 VF2:TrFE | 0.924 | 0.188 | 0.083 | ND[7] | 98° C. 147° C. | 4500 | |
| FIG. 18 | 11 | 10:23 PDD[2]:CF$_2$=CFCl 10:23 PDD:CTFE | 1.44 | 0.018 | 0.046 | | | 1903 | 6 k |
| FIG. 8 | 12 | 2:98 CF3CF=CF2:CF$_2$=CFH 2:98 HFP:TrFE | 1.37 | 0.143 | −0.02 | | 179° C. | 1389 | 6 k |
| FIG. 2 Ex. A | 13 | Poly(CF$_2$=CFOCF$_2$CF$_2$CF=CF$_2$) Cytop | 1.9 | 0.02 | 0.02 | 108° C. | | 5595 | 6 k |
| FIG. 8 | 14 | 1:1 CF$_3$CF=CF$_2$:CF$_2$=CF$_2$ 1:1 HFP:TFE | 3.9 | 0.086 | 0.073 | ~30° C. | | 1850 | 6 k |
| FIG. 18 Ex. 26 | 15 | 5:4 CF$_2$=CH$_2$:CF$_2$=CFCl 5:4 VF2:CTFE | 5.6 | 0.27 | 0.12 | 99° C. | | | |
| FIG. 18 Ex. 27 | 16 | ~1:1 PMD[3]:TFE | 1.17 | −0.015 | 0.07 | 64° C. | | 2207 | 6 k |
| FIG. 15 Ex. 7 | 17 | 5:6 CF$_3$CH=CH$_2$:CF$_2$=CF$_2$ 5:6 TFP:TFE | 0.149 | 0.008 | −0.00085 | 9° C. | | 41413 | 1.5 k |
| FIG. 15 Ex. 8 | 18 | 47:53 (CF$_3$)$_2$C=CH$_2$:CH$_2$=CHF 47:53 HFIB:VF | 0.005 | −0.00082 | −0.002 | 18° C. | | 9239 | 1.5 k |
| FIG. 15 Ex. 9 | 19 | 5:2 CH$_2$▽CF$_2$CF$_3$OCF=CF$_2$ 5:2 VF2:PMVE | 0.016 | 0.006 | 0.004 | −32° C. | | 72750 | |
| FIG. 16 Ex. 10 | 20 | 13:10 CH$_2$=CF$_2$:CF$_3$OCF=CF$_2$ 13:10 VF2:PMVE | 0.034 | 0.015 | 0.018 | −29° C. | | 25970 | |
| FIG. 15 Ex. 11 | 21 | 7:5 CH$_2$=CF$_2$:CF$_3$CF$_2$CF$_2$OCF=CF$_2$ 7:5 VF2:PPVE | 0.028 | −0.003 | −0.00074 | −32° C. | | 29874 | |
| FIG. 15 Ex. 12 | 22 | 79:21 CH$_2$=CF$_2$:CF$_3$CF=CF$_2$ 79:21 VF2:HFP | 0.014 | −0.002 | −0.00056 | −22° C. | | 13000 | |
| FIG. 16 Ex. 13 | 23 | 10:27:63 CF$_3$CF=CF$_2$:CF$_3$OCF=CF$_2$:CH$_2$=CF$_2$ 10:27:63 HFP:PMVE:VF2 | 0.008 | −0.00048 | −0.00045 | ND[7] | | 316500 | |
| FIG. 16 Ex. 14 | 24 | 59:41 (CF$_3$)$_2$C=CH$_2$:CH$_2$=CF$_2$ 59:41 HFIB:VF | −0.013 | −0.016 | −0.011 | 115° C. | | 7500 | |
| FIG. 16 Ex. 15 | 25 | 6:5 PDD[2]:CF$_3$OCF=CF$_2$ 6:5 PDD:PMVE | 0.209 | 0.006 | 0.013 | 133° C. | | 12450 | |
| FIG. 17 Ex. 16 | 26 | 20:11 CH$_2$=CHF:CF$_2$=CHCl 20:11 VF:ClDFE | 0.226 | 0.036 | 0.003 | ND[7] | | 9461 | |
| FIG. 17 | 27 | 1:2 PDD[2]:CH$_2$=CF$_2$ 1:2 PDD:VF2 | 0.009 | 0.003 | −0.00030 | 52° C. | | 82000 | |
| | 28 | 2:1 PDD[2]:CH$_2$=CF$_2$ 2:1 PDD:VF2 | | | | 96° C. | | | |
| FIG. 19 | 29 | 5:8 PDD[2]:CH$_2$=CF$_2$ 5:8 PDD:VF2 | 0.018 | 0.010 | 0.000057 | 59° C. | | 38298 | |
| Ex. 19 | 30 | 5:3:1 (CF$_3$)$_2$C=CH$_2$:CH$_2$=CF$_2$:CH$_2$=CHF 5:3:1 HFIB:VF2:VF | | | | 48° C. | | | |
| FIG. 19 Ex. 19 | 31 | 41:37:22 (CF$_3$)$_2$C=CH$_2$:CH$_2$=CHF:CH$_2$=CF$_2$ 41:37:22 HFIB:VF:VF2 | 0.016 | −0.010 | −0.002 | 71° C. | | 5289 | |

TABLE 2-continued

Absorbance per micron (A/μm) for Selected Fluoropolymers

Figure 17:
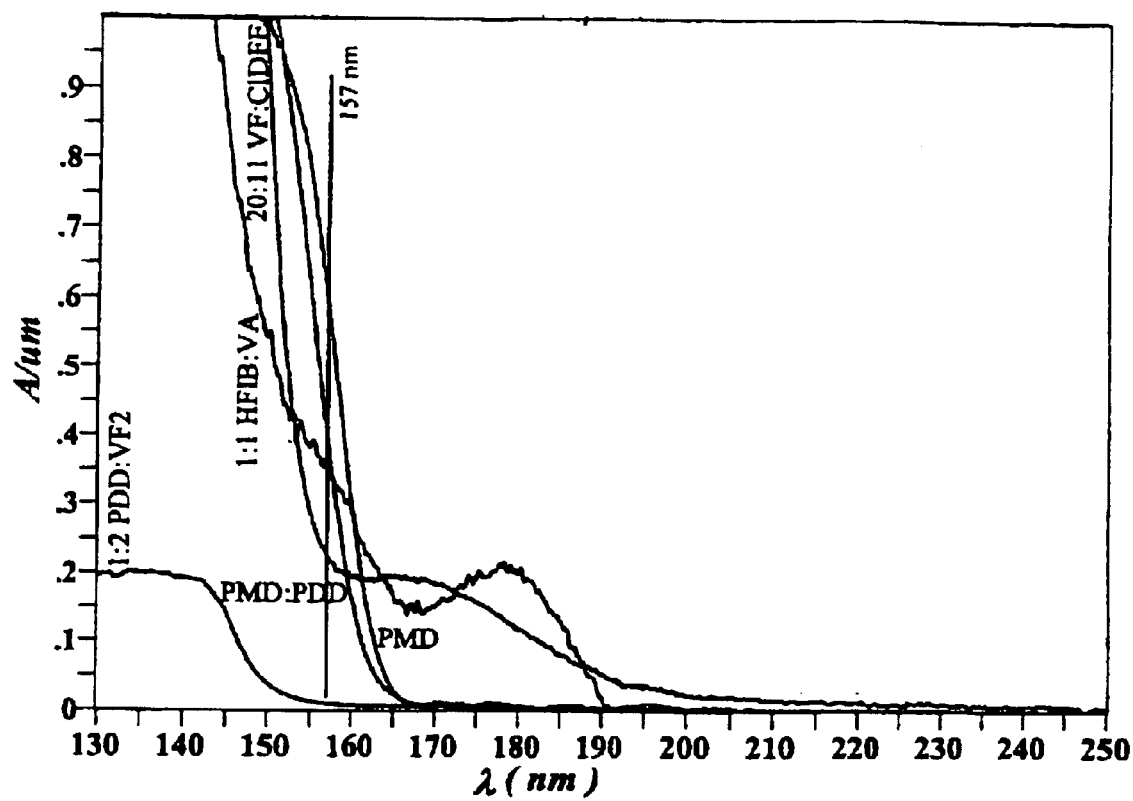

| Figure #, Example # | Sample # | Structure Name | A/μm 157 nm | A/μm 193 nm | A/μm 248 nm | Tg | Tm | Thick Angstroms | Spin Speed Rpm |
|---|---|---|---|---|---|---|---|---|---|
| FIG. 17 Ex. 23 | 32 | 1:1 $(CF_3)_2C=CH_2:CH_2=CH(OH)$ 1:1 HFIB:VA | 0.350 | −0.047 | −0.107 | 90° C. | | 1350 | |
| FIG. 17 Ex. 28 | 33 | Poly[perfluoro(2-methylene-4-methyl-1,3-dioxolane)] PMD | 0.603 | −0.0007 | −0.0001 | 135° C. | | 14818 | |
| FIG. 17 Ex. 29 | 34 | 1:1 PMD$^3$:PDD$^2$ 1:1 PMD:PDD | 0.404 | 0.006 | −0.002 | 147° C. | | 12762 | |
| Ex. 30 | 35 | 54:46 PMD3:$CH_2=CF_2$ PMD:VF2 | 0.085 | 0.002 | 0.002 | | | | |

(A/μm) determined from VUV transmission based absorbance measurements, one result, marked by # was determined from VUV ellipsometry
[1] J. Scheirs, editor, Modern Fluoroplastics, John Wiley U Sons, West Sussex, England, 1997, Chapter 28
[2] PDD = 4,5-difluoro-2,2-bis(trifluoromethyl)-1,3-dioxole
[3] PMD = Perfluoro(2-methylene-4-methyl-1,3-dioxolane
[4] Teflon ® AF 2400
[5] Teflon ® AF 1601
[7] Teflon ® AF 1200
[7] Monomers were loaded at 3:4 mole ratio. Polymer product not analyzed Three of the acyclic polymer structures listed in Table 2 show no detectable UV absorption at 157 nm (polymers $VF_2$:HFP, HFIB:TrFE, and HFIB:VF). These are copolymers containing either vinylidene fluoride ($VF_2$) or hexafluoroisobutylene (HFIB). $VF_2$ and HFIB have a unique structural feature in common. Taken by itself, for example, the hexafluoroisobutylene monomer can not form $CH_2$ nms longer than $CH_2CH_2$ before the run is broken up by a $—C(CF_3)_2—$ segment. Similarly vinylidene fluoride can not form of $CH_2$ nms longer than $CH_2CH_2$ before they are broken up by a $CF_2$ or $CF_2$ runs longer than $CF_2CF_2$ before they broken up by a $CH_2$. That is, $CX_2=CY_2$ monomers such as $VF_2$ and HFIB have the property of being "self-interrupting" when judging the potential for extended interactions between C—F bonds or extended interactions between C—H bonds. The stiff five membered ring of PDD likely has a related effect by forcing conformations unfavorable for interaction. Comparing PDD/TFE copolymers 5, 7, and 8, absorption falls off from 0.6 to 0.4 to 0.0 as TFE content drops from 52 to 32 to 11 mole %. That is, transparency improves as increasing PDD content interrupts $(CF_2)_n$ runs. It is anticipated that other perfluorinated ring structures or partially fluorinated ring structures can be found that will serve the same interrupting function as PDD.

Solutions of TFE:HFP and TrFE:HFP were spin coated at spin speeds of 6000 rpm onto $CaF_2$ substrates to produce polymer films of 1850 angstroms and 1389 angstroms thicknesses respectively. VUV absorbance measurements were then used to determine the absorbance per micron.

The introduction of TrFE in place of TFE demonstrates another example of decreasing the 157 nm absorbance/micron. The absorbance in units of inverse microns for TFE:HFP and TrFE:HFP versus wavelength lambda (λ) in units of nanometers is shown in FIG. 8. The presence of the CHF carbons in the $CF_2=CFH$ monomer interrupts extended $CF_2$ runs.

This produces a decrease in the 157 nm absorbance of TFE:HFP of 3.9/micron to an absorbance/micron of 1.37/micron for TrFE/HFP. This effect can also be understood as the absorption maxima of TFE:HFP polymer shifts to shorter wavelengths in the TrFE:HFP polymer.

Polymer relatively transparent at 157 nm tend to be even more transparent at longer wavelengths, including the region of interest here, 187–260 nm. Thus, we define a class of polymers highly transparent (A/μ <1, more preferably A/μ <0.1) to light of <260 nm made by homo or copolymerizing PDD and $CX_2=CY_2$ monomers (X=—F or —$CF_3$ and Y=—H) and optionally other monomers $CR^aR^b=CR^cR^d$ where any one or all of $R^a$, $R^b$ or $R^c$, may be H or F and where $R^d$ may be F, —$CF_3$, —ORf where —Rf is $C_nF_{2n+1}$ with n=1 to 3, OH (when $R^c$=H), and Cl (when $R^a$, $R^b$, and $R^c$=F)as needed to introduce solubility or break crystallinity.

When the $CR^aR^b=CR^cR^d$ monomer polymerizes in an alternating fashion with PDD or the $CX_2=CY_2$ monomer, a higher concentration of the $CR^aR^b=CR^cR^d$ monomer can be tolerated. An example of this is the 1:1 HFIB:TrFE copolymer which had an A/μ of −0.05 (Table 2, polymer #3). Random and alternating structures of course are never 100% ideal and some monomers naturally tend to either block or avoid polymerizing with themselves so the limits of 25% $CR^aR^b=CR^cR^d$ for random structures and 50% $CR^aR^b=CR^cR^d$ for alternating structures are approximate. Other highly transparent combinations include ~2:1 to 1:2 copolymers of $CH_2=CHCF_3:CF_2=CF_2$, $CH_2=CHF:CF_2=CFCl$, $CH_2=CHF:CClH=CF_2$. Preferred monomers for $CX_2=CY_2$ include vinylidene fluoride and hexafluoroisobutylene. Preferred $CR^aR^b=CR^cR^d$ monomers are ones that introduce an asymmetric center in the polymer chain such as vinyl fluoride, trifluoroethylene, hexafluoropropylene, and chlorotrifluoroethylene so as to increase solubility and break crystallinity. Finally it should be pointed out that making highly transparent structures as defined above does not automatically make a polymer useful for all claimed applications. It has already been pointed out for example that the crystallinity of poly(vinylidene fluoride) precludes its use as a perfectly clear and transparent optical material [that is the failure of poly(vinylidene fluoride) as a pellicle would not be in the absorption but for a physical reason (light scattering)]. As another example, poly(4,5-difluoro-2,2-bis(trifluoromethyl)-1,3-dioxole) is too insoluble to easily spin coat as thick films. In the case of poly(4,5-difluoro-2,2-bis(trifluoromethyl)-1,3-dioxole) this can be gotten around by coating liquid monomer and polymerizing in place. Films of thickness greater than about 250 nm can be prepared by placing monomer optionally diluted with solvent and/or initiator in the location where the film is desired. Polymerization can be initiated by appropriate physical and/or chemical means which leads to the deposition of polymer, as formed, in the desired location. The result, after subsequent solvent removal, is a film of polymer thicker than can be prepared by customary solvent coating techniques. As a final example, poly[vinylidene fluoride/perfluoro(methyl vinyl ether)] is a tacky gum useful for glues but not useful as a self-supporting pellicle film. As used herein, the term amorphous fluoropolymer means a fluoropolymer that exhibits no melting point when analyzed by Differential Scanning Calorimetry. No melting point means no melting associated thermal event of greater than 1 Joule/gram.

Listing a monomer as a precursor to transparent polymers is not meant to imply that it will either homopolymerize or form a copolymer with any other listed monomer. Hexafluoroisobutylene for example, does not form useful quantities of decent molecular weight homopolymer or copolymerize with tetrafluoroethylene under ordinary conditions. While these materials are being claimed for use at 187 to 260 nm, they also make excellent clear polymers at longer wavelengths, up to 800 nm, and may also be suitable for some applications at still shorter wavelengths. Specifically preferred wavelengths are 245–255 nm, 187–199 nm most preferred.

EXAMPLES

Many of the polymers tested were obtained as commercial samples.
Teflon® AF 1200: DuPont, Wilmington, Del.
Teflon® AF 1600: DuPont
Teflon® AF 2400: DuPont
Cytop™: Asahi Glass, poly[perfluoro(butenyl vinyl ether)]
~1:1 Poly(hexafluoropropylenetetrafluoroethylene) was made by the procedure described in U.S. Pat. No. 5,478,905, Dec. 26, 1995.

Many of remaining polymer compositions are known to the art and were prepared by standard methods. Typically autoclaves were loaded with monomer, solvent and initiator and heated to start polymerization. Most polymerizations were initiated using hexafluoropropylene oxide dimer peroxide 1 (DP) at ambient temperatures.

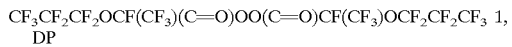
$CF_3CF_2CF_2OCF(CF_3)(C=O)OO(C=O)CF(CF_3)OCF_2CF_2CF_3$ 1, DP

DP was prepared and used as a 0.05 to 0.2 molar solution in solvents such as Vetrel™ XF ($CF_3CFHCFHCF_2CF_3$) or 3M's Performance Fluid PF-5080 (largely perfluorooctane). DP can be made conveniently by either a routine laboratory procedure [Chengue, et al, *J. Org. Chem.*, 47, 2009 (1982)] or on demand by a jet mixer process (U.S. Pat. No. 5,962,746 of Oct. 5, 1999). The reaction mixture was then recovered and the polymer isolated by evaporation or filtration. Polymer compositions were determined by elemental analysis or by NMR. Procedures are given for the preparation of new compositions of matter, and representative procedures are given for previously known compositions.

The polymer films were prepared by spin coating of the polymer solutions onto $CaF_2$ substrates and then the polymer film on substrate samples were subjected to a post apply bake so as to assure that no residual solvents were remaining in the polymer film. The post apply bake temperature was in the range from 120° C. to 250° C. on a hot plate for two to five minutes or in a vacuum oven overnight. The spin speeds for the samples are listed in Table 2.

Polymer film thicknesses were determined using single or multiple wavelength ellipsometry as discussed below, or by analysis using a Filmetrics Model F20 thin film measurement system (Filmetrics, Inc. 7675 Dagget St., Suite 140, San Diego, Calif. 92111-2255). Film Thicknesses are reported in Table 2. For some materials, two films, of differing thicknesses are presented in the table, and Absorbance/micron values for each film are presented.

Comparative Example A Teflon™ AF 1601 and Cytop™

Solutions of Teflon® AF 1601 were spin coated at spin speeds of 6000 rpm onto $CaF_2$ substrates to produce polymer films of 3323 angstroms thickness. VUV absorbance measurements were then used to determine the absorbance per micron.

Teflon® AF 1601 is a 68:32 PDD:TFE polymer which is currently used as a polymer for pellicles designed for use at lithographic wavelengths of 248 nm and 193 nm. The absorbance/micron for 157 nm light is 0.42/microns as determined from VUV absorbance measurements. From FIG. 1 this corresponds to pellicle transmissions below 70% for pellicle films of only 0.2 microns thickness, of course these results do not consider the additional effects of the thin film interference effects which arise from a properly designed pellicle film.

Figure 3:
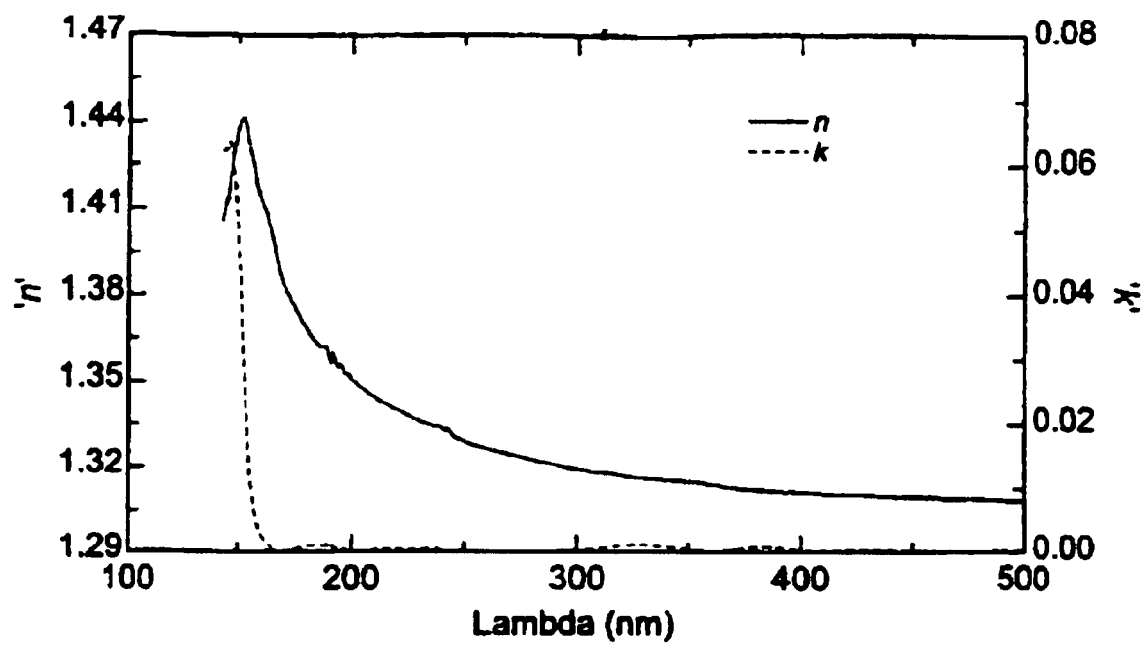
FIG. 3 describes the index of refraction n and the extinction coefficient k determined for a Teflon® AF 1601 film (Sample 7b) of thickness 2146 angstroms on a silicon substrate versus wavelength lambda in units of nanometers determined by VUV spectroscopic ellipsometry.

To determine the VUV optical properties of Teflon® AF 1601, VUV ellipsometry was performed on a Teflon® AF 1601 polymer sample on a silicon wafer, and the index of refraction and extinction coefficient shown in FIG. 3 was determined. The 157 nm index of refraction for Teflon® AF 1601 is 1.4251. The 157 nm extinction coefficient determined corresponds to an absorbance/micron of 0.35/micron and is also listed in Table 2.

Figure 4:
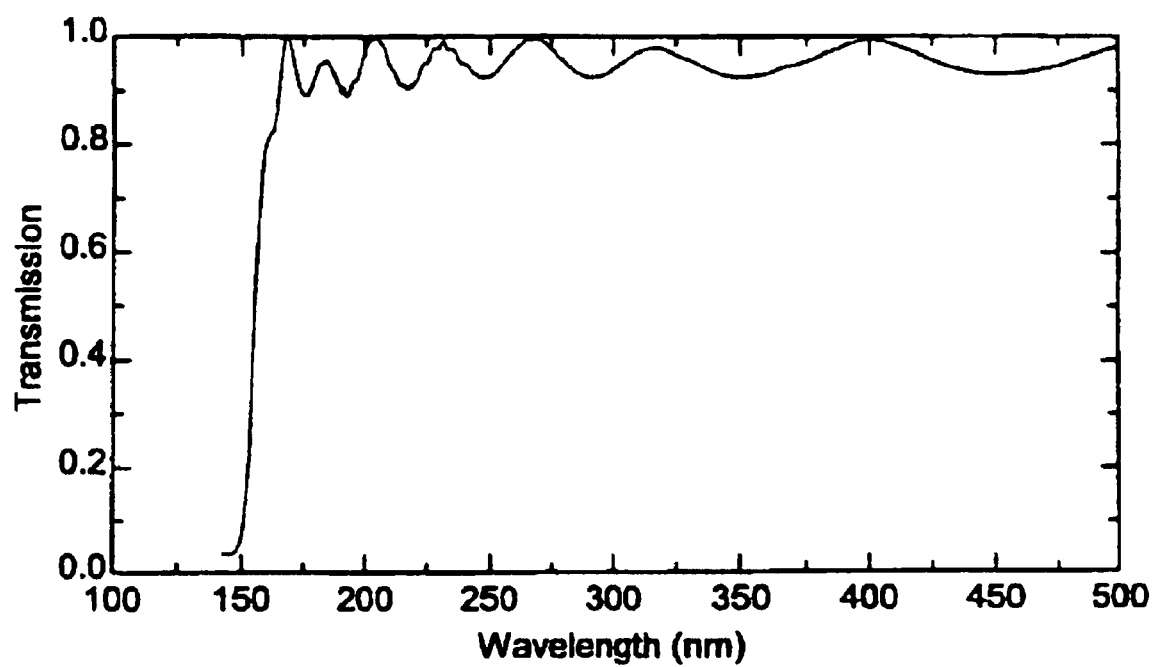
FIG. 4 describes the spectral transmission in absolute units versus the wavelength lambda in units of nanometers for a pellicle of Teflon® AF 1601 designed as an unsupported tuned etalon with a film thickness of 6059 angstroms. The interference fringes of the tuned etalon are clearly visible as a function of wavelength.
Figure 5:
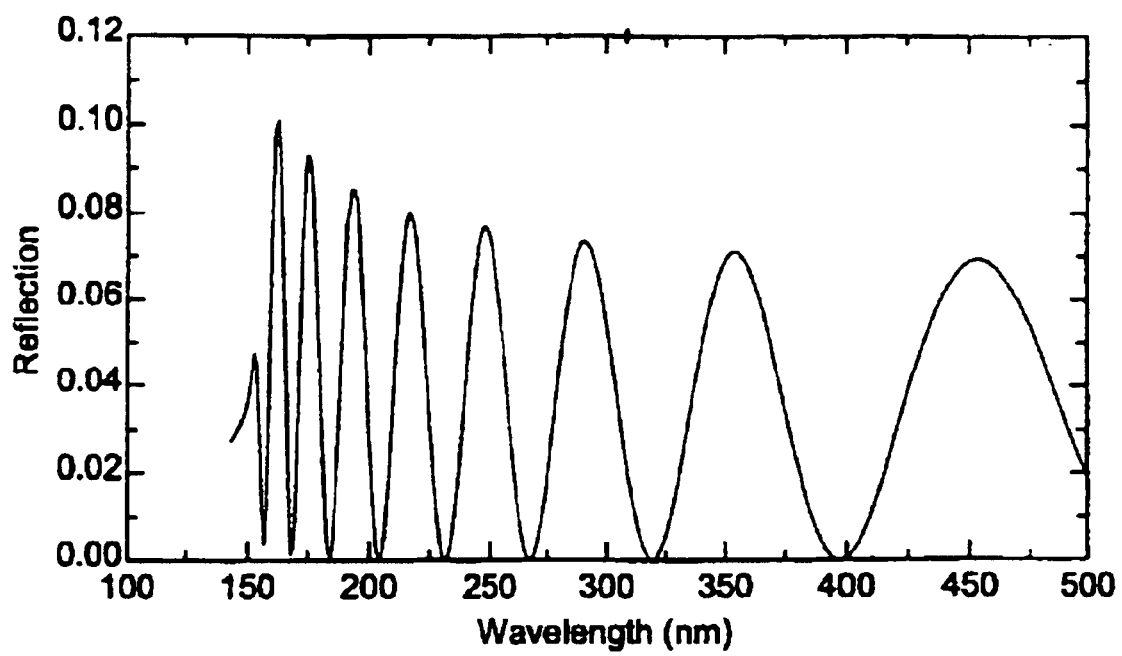
FIG. 5 describes the spectral reflectance in absolute units versus the wavelength lambda in units of nanometers for a pellicle of Teflon® AF 1601 designed as an unsupported tuned etalon with a film thickness of 6059 angstroms. The interference fringes of the tuned etalon are clearly visible as a function of wavelength, and a minimum in the pellicle reflectance is seen at 157 nm which contributes to the maximized pellicle transmission at this lithographic wavelength.

With these Teflon® AF 1601 optical properties, and the methods of O. S. Heavens discussed above, one can design the tuned etalon pellicle film, whereby the reflectance of the unsupported pellicle film is minimized and the pellicle transmission is maximized. (An etalon is a thin film in which thin film interference effects such as constructive and destructive interference of the light from the front and back surfaces of the constant thickness film gives rise to optical fringes in the wavelength dependence of the reflectance or transmission of the thin film (Principles of Optics, a book by Max Born and Emil Wolf, Pergamon Press, New York, 6th Edition, copyright 1980, PP 329–333). For a pellicle film thickness of 6059 angstroms, a 157 nm pellicle transmission is 65.7% while the 157 nm pellicle reflectance is 0.4%. The spectral transmission in absolute units versus the wavelength lambda in units of nanometers for a pellicle of Teflon® AF 1601 designed as an unsupported tuned etalon with a film thickness of 6059 angstroms is shown in FIG. 4. The interference fringes of the tuned etalon are clearly visible as a function of wavelength. The spectral reflectance in absolute units versus the wavelength lambda in units of nanometers for the pellicle of Teflon® AF 1601 designed as an unsupported tuned etalon with a film thickness of 6059 angstroms is shown in FIG. 5. The interference fringes of the tuned etalon are clearly visible as a function of wavelength, and a minimum in the pellicle reflectance is seen at 157 nm which contributes to the maximized pellicle transmission at this lithographic wavelength. For a 157 nm pellicle film of Teflon® AF 1601 with a film thickness of 6335 angstroms, the tuned etalon will not be optimized for maximum pellicle transmission and the 157 nm pellicle transmission will be 59.4% while the 157 nm pellicle reflectance increases to 8.1%.

Figure 6:
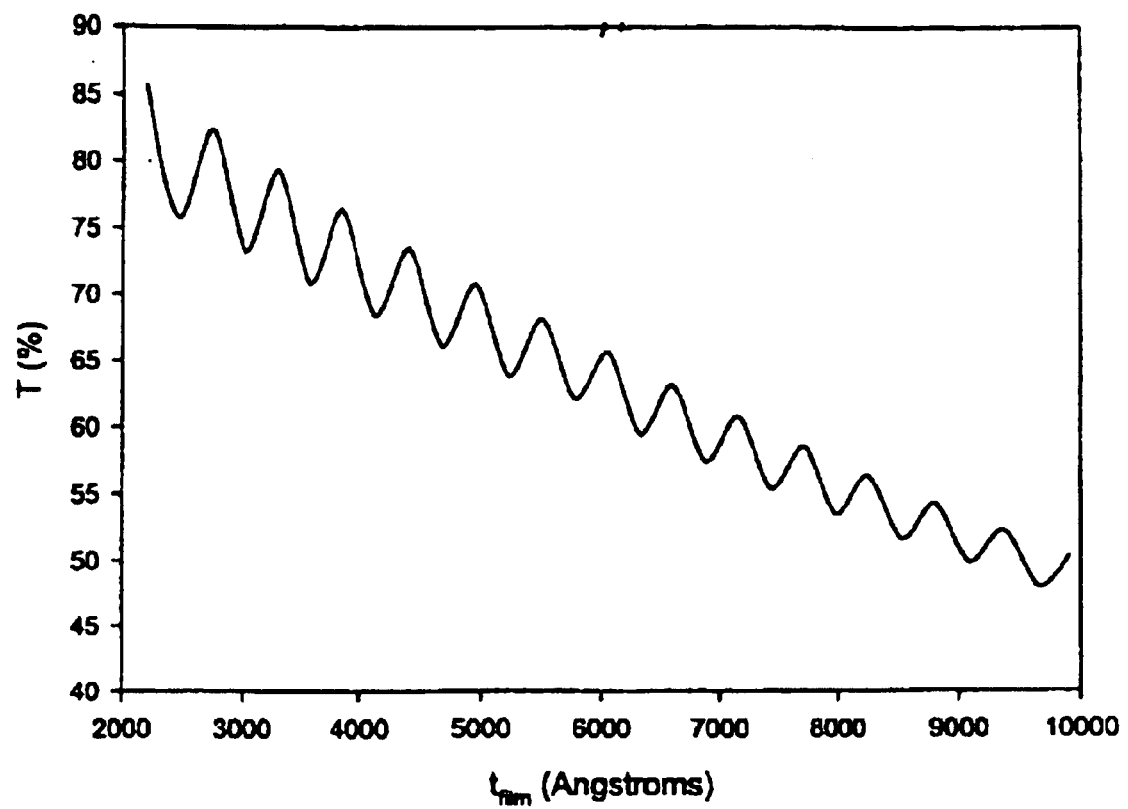
FIG. 6 describes transmission of a tuned etalon pellicle film of Teflon® AF 1601 at a lithographic wavelength of 157 nm as a function of the pellicle film thickness. The oscillations in the pellicle transmission with thickness arise due the thin film interference fringes in the film and give rise to pellicle transmission maxima and minima. The optimum tuned etalon pellicle design will correspond to the film with sufficient mechanical integrity and a thickness such that the transmission is at a maxima. Still as can be seen, pellicles designed from this material have substantially lower transmissions than the target transmission for a 157 nm pellicle.

Transmission of a tuned etalon pellicle film of Teflon® AF 1601 at a lithographic wavelength of 157 nm as a function of the pellicle film thickness is shown in FIG. 6. The oscillations in the pellicle transmission with thickness arise due the thin film interference fringes in the film and give rise to pellicle transmission maxima and minima. The optimum tuned etalon pellicle design will correspond to the film with sufficient mechanical integrity and a thickness such that the transmission is at a maxima. Still as can be seen, pellicles designed from this material have substantially lower transmissions than the target 98% transmission for a 157 nm pellicle.

Pellicles designed from Teflon® AF 1601 are not able to achieve pellicle transmissions above 98%. Pellicles designed from Cytop™, which has a much higher 157 nm absorbance/micron, will have even lower 157 nm pellicle transmissions. This demonstrates that methods are needed to produce polymers with dramatically lower 157 nm absorbance/micron so as to meet the desired 157 nm transmission of 98% for a pellicle film. Therefore we need polymers with substantially lower absorbance/micron.

Samples 7 and 8—Teflon™ AF 1200, 1601, 2400

Solutions of Teflon® AF 1200, 1601, and 2400 were spin coated at spin speeds of 6000 rpm onto $CaF_2$ substrates to produce polymer films of 4066 angstroms, 3323 angstroms and 2133 angstroms thicknesses respectively. VUV absorbance measurements were then used to determine the absorbance per micron.

The absorbance in units of inverse microns for Teflon® AF 1200 versus wavelength lambda ($\lambda$) in units of nanometers is shown in FIG. 7 for Sample 8. The 157 nm absorbance/micron determined is 0.64/micron. The 193 nm absorbance/micron determined is 0.004/micron. The 248 nm absorbance/micron determined is −0.001/micron.

The absorbance in units of inverse microns for Teflon® AF 1601 versus wavelength lambda ($\lambda$) in units of nanometers is shown in FIG. 7 for Sample 7a. The 157 nm absorbance/micron determined is 0.42/micron. The 193 nm absorbance/micron determined is 0.02/micron. The 248 nm absorbance/micron determined is 0.01/micron.

The absorbance in units of inverse microns for Teflon® AF 2400 versus wavelength lambda ($\lambda$) in units of nanometers is shown in FIG. 7 for Sample 5. The 157 nm absorbance/micron determined is 0.007/micron. The 193 nm absorbance/micron determined is −0.06/micron. The 248 nm absorbance/micron determined is −0.06/micron.

One way to dramatically reduce the 157 nm absorbance of a PDD:TFE polymer is by increasing the percentage of PDD in the polymer. The stiff five membered ring of PDD likely has a similar effect, as $VF_2$ and HFIB, of being "self-interrupting" when judging the potential for extended interactions between C—F bonds by forcing unfavorable conformations. This is shown in FIG. 7 where the absorbance in units of inverse microns for Teflon® AF 1200, Teflon® AF 1601, and Teflon® AF 2400 versus wavelength lambda ($\lambda$) in units of nanometers demonstrate the decreasing 157 nm absorbance/micron for these polymers. Comparing PDD/TFE copolymers Teflon® AF 1200, 1601, and 2400, absorbance/micron at 157nm falls off from 0.6 to 0.4/micron to 0.01/micron as TFE content drops from 52 to 32 to 11 mole %. That is, transparency improves as increasing PDD content interrupts $(CF_2)_n$ runs. It is anticipated that other perfluorinated ring structures or partially fluorinated ring structures can be found that will serve the same interrupting function as PDD Example 2—HFIB/TrFE Preparation of 1:1 Poly (hexafluoroisobutylene:Trifluoroethylene)

A 75 ml stainless steel autoclave chilled to <−20° C. was loaded with 25 ml of $CCl_2FCF_2Cl$ and 5 ml of ~0.17 M DP in Vertrel™ XF. The autoclave was cooled, evacuated, and further loaded with 10 g of trifluoroethylene and 20 g of hexafluoroisobutylene. The reaction mixture was shaken overnight at ambient temperatures (28 to 33° C.), removed from the autoclave, and evaporated down to a glassy film that was further dried for 72 hours in a 75° C. vacuum oven. There was obtained 3.33 g of white solid. A solution was made by rolling 3.24 g of this polymer with 6.99 g of 1-methoxy-2-propanol acetate (PGMEA). This solution was mixed with 0.2 g of chromatographic silica gel and 0.2 g of decolorizing carbon and then passed first through a $0.45\mu$ glass microfiber syringe filter (Whatman, Autovial™) and then through a $0.45\mu$ PTFE membrane syringe filter (Whatman, Autovial™). Fluorine NMR of this solution, integrating trifluoroethylene's CHF fluorine at ~−180 to −220 ppm versus hexafluoroisobutylene's $CF_3$ fluorines at ~−58 to −65 ppm, found ~1:1 hexafluoroisobutylene:trifluoroethylene. This solution was used to spin coat thick films on optical substrate for absorption measurements.

Sample preparation and results:

Solutions of HFIB:TrFE were spin coated at spin speeds of 3000 rpm and 6000 rpm onto $CaF_2$ substrates to produce polymer films of 12,146 angstroms and 1500 angstroms thicknesses respectively. VUV absorbance measurements were then used to determine the absorbance per micron.

The absorbance in units of inverse microns for 3:2 HFIB:TrFE versus wavelength lambda ($\lambda$) in units of nanometers is shown in FIG. 9 for Sample 3a The 157 nm absorbance/micron determined from the thicker polymer film is 0.012/micron. The 193 nm absorbance/micron determined is 0.005/micron. The 248 nm absorbance/micron determined is −0.001/micron.

Example 3—HFIB/VF

Preparation of 3:2 Poly(hexafluoroisobutylene:Vinyl Fluoride)

A 75 ml stainless steel autoclave chilled to <−20° C. was loaded with 25 ml of $CCl_2FCF_2Cl$ and 10 ml of ~0.07 M DP in Vertrel™ XF. The autoclave was cooled, evacuated, and further loaded with 16 g of hexafluoroisobutylene and 5 g of vinyl fluoride. The reaction mixture was shaken overnight at ambient temperatures (18 to 26° C.), removed as a thick gel from the autoclave, evaporated, pumped down further with a vacuum pump for 96 hours, and then dried 22 hours in a 75° C. vacuum oven. There was obtained 19 g of friable white solid with a $T_g$ of 58° C. (nitrogen, 10° C./min, second heat) and no detectable $T_m$.

| | | |
|---|---|---|
| Calc for $(HFIB)_3(VF)_2$: | 32.89% C | 2.07% H |
| Found: | 32.83% C | 2.08% H |

Solution preparation and results:

A solution was made by rolling 6 g of this polymer with 12 g of 2-heptanone. This solution was passed through a $0.45\mu$ glass microfiber syringe filter (Whatman, Autovial™) and the filtrate used to spin coat thick films on optical substrate for absorption measurements.

Sample preparation and results:

Solutions of HFIB:VF were spin coated at spin speeds of 3000 rpm and 6000 rpm (revolutions per minute) onto $CaF_2$ substrates to produce polymer films of 14,386 angstroms and 2870 angstroms thicknesses respectively. VUV absorbance measurements were then used to determine the absorbance per micron.

The absorbance in units of inverse microns for 1:1 HFIB:VF versus wavelength lambda ($\lambda$) in units of nanometers is shown in FIG. 9 for Sample 4a.

The 157 nm absorbance/micron determined from the thicker polymer film is 0.027/micron. The 193 nm absorbance/micron determined is 0.020/micron. The 248 nm absorbance/micron determined is 0.008/micron.

To determine the VUV optical properties of HFIB:VF, VUV ellipsometry was performed on an HFIB:VF polymer sample on a silicon wafer, and the index of refraction and extinction coefficient shown in FIG. 10 was determined. The 157 nm index of refraction for Teflon® AF 1601 is 1.50. The 157 nm extinction coefficient determined corresponds to an absorbance/micron of 0.022/micron and is also listed in Table 2.

Figure 11:
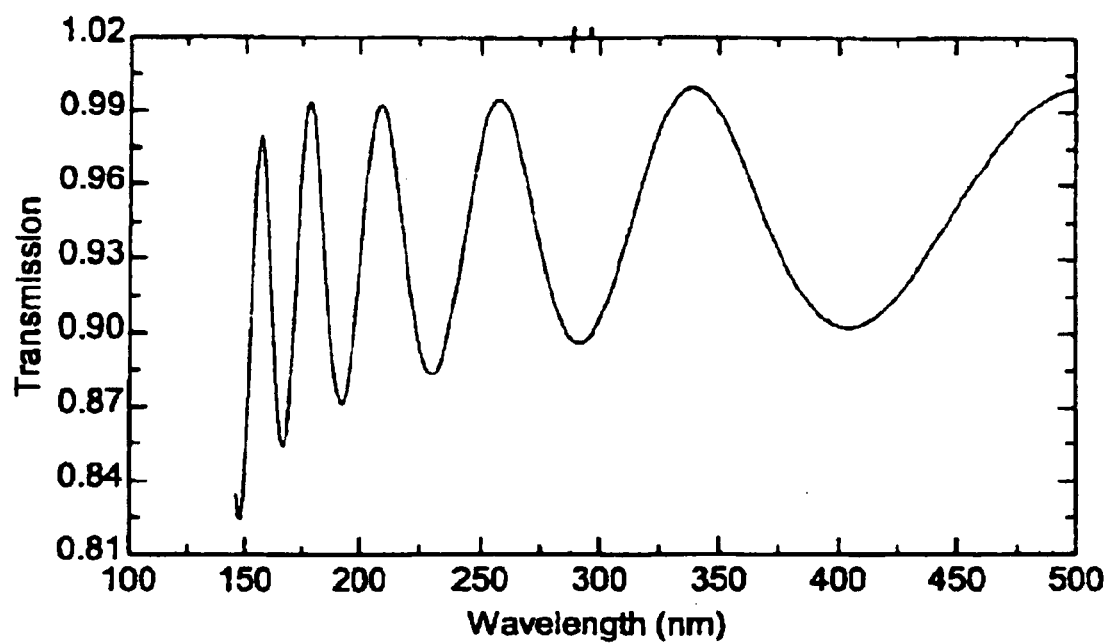
FIG. 11 describes the spectral transmission in absolute units versus the wavelength lambda in units of nanometers for a pellicle of HFIB:VF designed as an unsupported tuned etalon with a film thickness of 3660 angstroms. The interference fringes of the tuned etalon are clearly visible as a function of wavelength.
Figure 12:
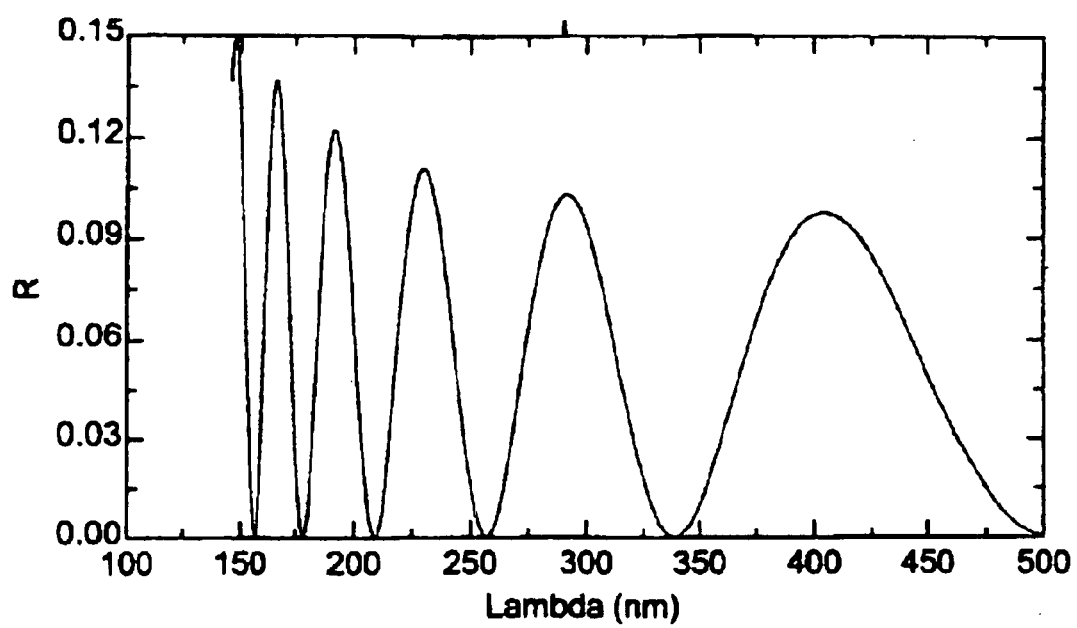
FIG. 12 describes the spectral reflectance in absolute units versus the wavelength lania in units of nanometers for a pellicle of HRIB:VF designed as an unsupported tuned etalon with a film thickness of 3660 angstroms. The interference fringes of the tuned etalon are clearly visible as a function of wavelength, and a minimum in the pellicle reflectance is seen at 157 nm which contributes to the maximized pellicle transmission at this lithographic wavelength.

With these HFIB:VF optical properties, and the methods of O. S. Heavens discussed above, one can design the tuned etalon pellicle film, whereby the reflectance of the unsupported pellicle film is minimized and the pellicle transmission is maximized. For a pellicle film thickness of 3660 angstroms, a 157 nm pellicle transmission is 98% while the 157 nm pellicle reflectance is 0.08%. The spectral transmission in absolute units versus the wavelength lambda in units of nanometers for a pellicle of HFIB:VF designed as an unsupported tuned etalon with a film thickness of 3660 angstroms is shown in FIG. 11. The interference fringes of the tuned etalon are clearly visible as a function of wavelength. The spectral reflectance in absolute units versus the wavelength lambda in units of nanometers for the pellicle of HFIB:VF designed as an unsupported tuned etalon with a film thickness of 3660 angstroms is shown in FIG. 12. The interference fringes of the tuned etalon are clearly visible as a function of wavelength, and a minimum in the pellicle reflectance is seen at 157 nm which contributes to the maximized pellicle transmission at this lithographic wavelength. For a 157 nm pellicle film of HFIB:VF with a film thickness of 3660 angstroms, the tuned etalon is a 157 nm pellicle with a 157 nm pellicle transmission of 98%.

Figure 13:
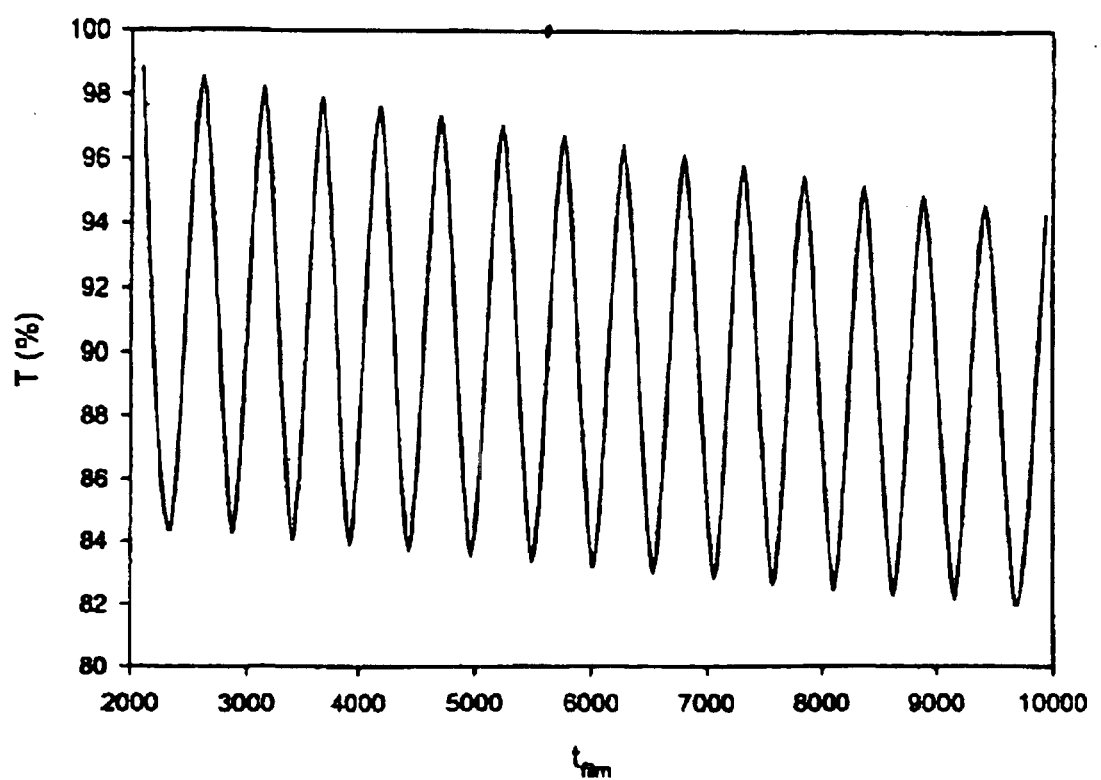
FIG. 13 describes transmission of a tuned etalon pellicle film of HFIB:VF with an absorbance per micron of 0.022 and an index of refraction of 1.5 at a lithographic wavelength of 157 nm as a function of the pellicle film thickness. Note that for pellicle film thicknesses up to 3660 angstroms, the maximum pellicle transmission is above the target specification of 98%.

Transmission of a tuned etalon pellicle film of HFIB:VF at a lithographic wavelength of 157 nm as a function of the pellicle film thickness is shown in FIG. 13. The oscillations in the pellicle transmission with thickness arise due the thin film interference fringes in the film and give rise to pellicle transmission maxima and minima.

Sample 2—VF2/PDD

Sample preparation and results: A 75 ml autoclave was loaded with 25 ml of $CF_2ClCCl_2F$, prechilled to <–20° C., loaded further with 0.3 g of Perkadox™ 16N [bis(4-t-butylcyclohexyl)peroxydicarbonate] and 20 g of 4,5-difluoro-2,2-bis(trifluoromethyl)-1,3-dioxole (PDD), evacuated, and 10.4 g of vinylidene fluoride ($VF_2$) added. Heating 18 hours at 70° C. gave a thick oil. Evaporation in air, drying 22 hours under pump vacuum, and drying 24 hours in a 75° C. oven gave 17 g of hard white foam.

| | | |
|---|---|---|
| Elemental analysis, found: | 28.99% C | 1.11% H |
| Calculated $(C_5F_8O_2)1(C_2H_2F_2)1$: | 29.05% C | 1.08% H |
| DSC, 10° C./min, nitrogen: | Tg = 56° C. (first heat) | |
| | Tg not detected second heat | |

A viscous solution was prepared by rolling 4 g of poly(PDD/$VF_2$) with 16 g of hexafluorobenzene and filtering through an 0.45 micron glass fiber syringe filter [Whatman, Autovial™]. The filtrate was used to spin coat thick films on optical substrate for absorption measurements.

Solutions of $VF_2$:PDD were spin coated at spin speeds of 6000 rpm onto $CaF_2$ substrates to produce polymer films of 2097 angstroms thickness. VUV absorbance measurements were then used to determine the absorbance per micron.

The absorbance in units of inverse microns for $VF_2$:PDD versus wavelength lambda ($\lambda$) in units of nanometers is shown in FIG. 9 for Sample 2. The 157 nm absorbance/micron determined from the thicker polymer film is –0.04/micron. For this very transparent material, this demonstrates an antireflective coating effect thereby producing an negative value of the 157 nm absorbance/micron. The 193 nm absorbance/micron determined is 0.02/micron. The 248 nm absorbance/micron determined is 0.08/micron.

Example 5—VF2/HFP

Sample preparation and results: A poly(vinylidene fluoride/hexafluoropropylene) sample made by the method of U.S. Pat. No. 4,985,520 of Jan. 15, 1991) was characterized.

Composition by Fluorine NMR in Deuteroacetone: 21 mole % $VF_2$, 79 mole % HFP

DSC, 10° C./min, nitrogen: Tg=–22.5° C. (second heat)

Inherent Viscosity, acetone, 25° C.=0.753 dL/g

Solutions of $VF_2$:HFP were spin coated at spin speeds of 3000 and 6000 rpm (revolutions per minute) onto $CaF_2$ substrates to produce polymer films of 69,800 angstroms and 1641 angstroms thickness. VUV absorbance measurements were then used to determine the absorbance per micron.

The absorbance in units of inverse microns for 79:21 $VF_2$:HFP versus wavelength lambda ($\lambda$) in units of nanometers is shown in FIG. 9 for Sample 1a. The 157 nm absorbance/micron determined from the thicker polymer film is 0.015/micron. The 193 nm absorbance/micron determined is 0.005/micron. The 248 nm absorbance/micron determined is 0.003/micron.

Example 6—VF2/HFP, VF2/PDD, HFIB/TrFE Pellicles

Figure 14:
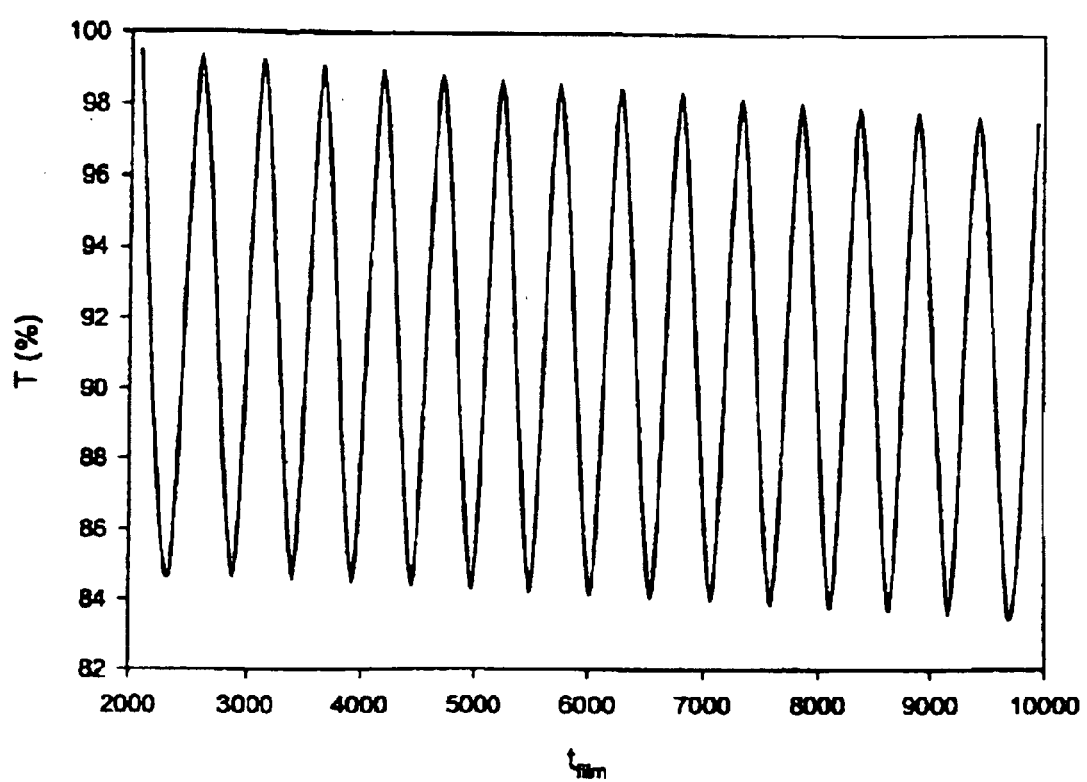
FIG. 14 describes transmission of a tuned etalon pellicle film of a polymer with an absorbance per micron of 0.01 and an index of refraction of 1.5 at a lithographic wavelength of 157 nm as a function of the pellicle film thickness. Note that for pellicle film thicknesses up to 8371 angstroms, the maximum pellicle transmission is above the target specification of 98%.

Using polymers such as $VF_2$:HFP, $VF_2$:PDD, and HFIB:TrFE, which have 157 nm absorbance/micron on the order of 0.01/micron, we can design tuned etalon pellicles with high transmissions and substantial film thicknesses. FIG. 14 shows the transmission of a tuned etalon pellicle film of a polymer with an absorbance per micron of 0.01 and an index of refraction of 1.50 at a lithographic wavelength of 157 nm as a function of the pellicle film thickness. Note that for pellicle film thicknesses up to 8371 angstroms, the maximum pellicle transmission is above the target specification of 98%.

Example 7—TFE/TrP

A. Polymerization of tetrafluoroethylene (TFE) with 3,3,3-trifluoropropene (TrP). A 240 ml autoclave was loaded with 20 ml of $CF_2ClCCl_2F$, chilled to <−20° C., and 10 ml of ~0.17 M DP in $CF_3CFHCFHCF_2CF_3$ added. The autoclave was further chilled, evacuated, and 10 g of TrP and 40 g of TFE added. After shaking overnight at room temperature, the autoclave was vented, and the fluid reaction mixture evaporated down, finishing with 48 hours at room temperature under pump vacuum. This gave 9.96 g of sticky, colorless gum.

Elemental analysis, found: 29.86C; 1.74 H

Calculated $(C_3H_3F_3)_5(C_2H_4)_6$: 30.02C; 1.40 H

DSC, 10° C./min, nitrogen: Tg=8.8° C. (second heat)

Solution preparation and results:

A solution was prepared by rolling 4 g of poly(TFE/TrP) with 12 g of hexafluorobenzene and filtering through a 0.45μ glass microfiber syringe filter (Whatman, Autovial™). The filtrate was used to spin coat thick films on optical substrate for absorption measurements.

Solutions of 5:6 TFP:TFE were spin coated onto $CaF_2$ substrates to produce polymer films of 41413 angstroms thickness. VUV absorbance measurements were then used to determine the absorbance per micron.

The absorbance in units of inverse microns for 5:6 TFP:TFE versus wavelength lambda (λ) in units of nanometers is shown in FIG. 15 for Sample 17. The 157 mm absorbance/micron determined is 0.149/micron. The 193 nm absorbance/micron determined is 0.008/micron. The 248 nm absorbance/micron determined is −0.00085/micron.

B. Use as a Glue for Quartz and Aluminum. An aluminum coupon measuring 1" wide by 3" long by 122 mil thick and a quartz slide measuring 1" wide by 3" long by 65 mil thick were both rinsed with $CF_2ClCCl_2F$ and air dried.

Rolling 4 g of the poly(TFE/TrP) prepared above with 12 g of hexafluorobenzene at room temperature gave a clear, colorless solution that was passed though a 0.45μ glass fiber filter. Three drops of this solution were placed on one end of the aluminum coupon and a quartz slide pressed down on top so that the last inch of the quartz slide overlapped with the last inch of the aluminum coupon. This caused any excess fluid to squeeze out and the remaining polymer solution to wet and spread out evenly over the area of overlap. Two C-clamps (stock no. 72020, ACCO USA Inc., 770-S ACCO Plaza, Wheeling, Ill. 60090) were used to hold the aluminum coupon and quartz slide in place while the hexafluorobenzene solvent evaporated for three days at room temperature. One such assembly with C-clamps still attached was heated for 16 hours in a 50° C. vacuum oven. The assembly was taken from the oven, cooled, the C-clamps removed, and the force required to pull the quartz slide away from the aluminum coupon measured in an Instron using a 3" jaw separation and a crosshead speed of 1"/minute. Twelve pounds of force were required. A second such assembly with C-clamps still attached was heated for 20 hours in a 50° C. vacuum oven and then for 24 hours in a 75° C. vacuum oven. Now the Instron required 127 pounds of force to pull the aluminum coupon and the quartz slide apart.

C. Use as a Glue for a Pellicle Polymer. Pellicle polymer poly(HFIB/VF) was prepared as a film by dissolving 10 g of poly(HFIB/VF) (Example 2A below) in 40 g of 2-heptanone, adding 1 g of decolorizing carbon+1 g of chromatographic alumina+1 g of chromatographic silica gel, filtering through an 0.45μ PTFE syringe filter, casting on Teflon™ FEP sheet with a 5 mil casting knife, and air drying. The poly(HFIB/VF) film prepared in this fashion could be lifted off the Teflon™ FEP sheet as clear, colorless film roughly 0.5 to 1 mil thick.

Glue solution was prepared next. Solution was made by dissolving 0.1 g of the poly(TFE/TrP) prepared above in 1 g of hexafluorobenzene.

This glue solution was used to make several ~½" spots on an aluminum coupon measuring 1" wide by 3" long by 122 mil thick. These glue spots were air dried for 39 minutes and then the coupon was placed in a 60° C. air oven for 8 minutes. As soon as the aluminum coupon was withdrawn hot from the oven, poly(HFIB/VF) film samples were pressed down on top of the poly(TFE/TrP) deposits with light finger pressure. The poly(HFIB/VF) film visibly wetted and adhered to the poly(TFE/TrP) spots. While the aluminum coupon was still hot, the poly(HFIB/VF) film could be pulled away with difficulty and stretching. Once, however, the aluminum coupon returned to room temperature, the poly(HFIB/VF) film tore rather than peeled free from the aluminum, The adhesive bond between the glue polymer [poly(TFE/TrP)] and the pellicle polymer [poly(HFIB/VF)] is quite strong, exceeding the strength of the pellicle polymer.

Example 8—HFIB/VF

A. Polymerization of Hexafluoroisobutylene (HFIB) with Vinyl Fluoride VF). A 400 ml autoclave was loaded with 200 ml water and 0.05 g of Vazo™ 56 WSP initiator. The autoclave was cooled and evacuated and then 80 g of hexafluoroisobutylene and 25 g of vinyl fluoride added. After shaking for ~48 hours at 50° C., the autoclave was vented, and an opalescent blue emulsion recovered. The emulsion was broken by vigorous agitation in a Waring blender, filtered, and washed four times in the Waring blender with 100 ml of methyl alcohol. Drying for 6 days under pump vacuum gave 30 g of white powder and lumps.

| | |
|---|---|
| Elemental analysis, found: | 34.80% C; 2.57% H |
| Calculated $(C_4F_6H_2)_{47}(C_2H_3F)_{53}$: | 34.79 C; 2.51% H |
| DSC, 10° C./min, nitrogen: | Tg = 70° C. (second heat) |
| | Tm not detected |
| Inherent Viscosity, THF, 25° C.: | 0.379 dL/g |
| GPC in THF: | Mw = 192,000 |
| | Mn = 92,000 |

A sample of poly(HFIB/VF) was prepared a second time by the same emulsion polymerization method and its thermal transitions looked at in detail by modulated DSC. On the second heat, glass transitions were detected at both 69.5° C. and 195° C. No melting transitions were observed on either first or second heats.

Solution preparation and results: A solution was made by rolling 10 g of the polymer with 40 g of 2-heptanone and filtering through a 0.45μ glass microfiber syringe filter (Whatman, Autovial™). The filtrate was used to spin coat thick films on optical substrate for absorption measurements.

Solutions of HFIB:VF were spin coated onto $CaF_2$ substrates to produce polymer films of 9239 angstroms thickness. VUV absorbance measurements were then used to determine the absorbance per micron.

The absorbance in units of inverse microns for HFIB:VF versus wavelength lambda (λ) in units of nanometers is shown in FIG. 15 for Sample 18. The 157 nm absorbance/micron determined is 0.005/micron. The 193 nm absorbance/micron determined is −0.00082/micron. The 248 nm absorbance/micron determined is −0.002/micron.

B. Use as a Glue for Quartz and Aluminum. An aluminum coupon measuring 1" wide by 3" long by 122 mil thick and a quartz slide measuring 1" wide by 3" long by 65 mil thick were both rinsed with $CF_2ClCCl_2F$ and air dried.

Rolling 2 g of the poly(HFIB/VF) prepared above with 18 g of acetone at room temperature gave a clear, colorless solution that was passed though a $0.45\mu$ glass fiber filter. Three drops of this solution were placed on one end of the aluminum coupon and a quartz slide pressed down on top so that the last inch of the quartz slide overlapped with the last inch of the aluminum coupon. This caused any excess fluid to squeeze out and the remaining polymer solution to wet and spread out evenly over the area of overlap. Two C-clamps (stock no. 72020, ACCO USA Inc., 770-S ACCO Plaza, Wheeling, Ill. 60090) were used to hold the aluminum coupon and quartz slide in place while the acetone solvent evaporated for three days at room temperature. One such assembly with C-clamps still attached was heated for 16 hours in a 50° C. vacuum oven. The assembly was taken from the oven, cooled, the C-clamps removed, and the force required to pull the quartz slide away from the aluminum coupon measured in an Instron using a 3" jaw separation and a crosshead speed of 1"/minute. One pound of force was required. A second such assembly with C-clamps still attached was heated for 16 hours in a 50° C. vacuum oven and then for 24 hours in a 75° C. vacuum oven. Now the Instron required 0.6 pounds of force to pull the aluminum coupon and the quartz slide apart.

Example 9—VF2/PMVE

A. Polymerization of Vinylidene Fluoride (VF2) with Perfluoromethylvinyl Ether (PMVE). A ~210 ml autoclave was loaded with 50 ml of $CF_2ClCCl_2F$ and 10 ml of ~0.2 DP in $CF_3CFHCFHCF_2CF_3$ solvent. The autoclave was cooled evacuated and 26 g VF2 and 33 g PMVE added. After shaking overnight at ambient temperatures (18–26° C.), the autoclave was vented, and viscous solution recovered. Excess solvent was evaporated under nitrogen and the polymer dried 72 hours under vacuum at room temperature and then for 28 hours at 75° C. in a vacuum oven, 33 g.

| | |
|---|---|
| Elemental analysis, found: | 29.64% C  1.73% H |
| Calculated $(C_2F_2H_2)_5(C_3F_6O)_2$: | 29.47% C  1.55% H |
| DSC, 10° C./min, nitrogen: | Tg = −32° C. (second heat) |
| Inherent Viscosity, $CF_3CFHCFHCF_2CF_3$, 25° C.: | 0.722 dL/g |

Solution preparation and results: A solution was made by rolling 4 g of this polymer with 16 g of hexafluorobenzene. This solution was passed through a $0.45\mu$ glass microfiber syringe filter (Whatman, Autovial™) and the filtrate used to spin coat thick films on optical substrate for absorption measurements.

Solutions of 5:2 VF2:PMVE were spin coated onto $CaF_2$ substrates to produce polymer films of 72,750 angstroms thickness. VUV absorbance measurements were then used to determine the absorbance per micron.

The absorbance in units of inverse microns for 5:2 VF2:PMVE versus wavelength lambda (λ) in units of nanometers is shown in FIG. 15 for Sample 19. The 157 nm absorbance/micron determined is 0.016/micron. The 193 nm absorbance/micron determined is 0.006/micron. The 248 nm absorbance/micron determined is 0.004/micron.

B. Use as a Glue for Quartz and Aluminum. An aluminum coupon measuring 1" wide by 3" long by 122 mil thick and a quartz slide measuring 1" wide by 3" long by 65 mil thick were both rinsed with $CF_2ClCCl_2F$ and air dried.

About 0.2 g of the poly(VF2/PMVE) was chopped into 3 to 4 small pieces and placed on one end of the aluminum coupon. A quartz slide was pressed down on top so that the last inch of the quartz slide overlapped with the last inch of the aluminum coupon. Two C-clamps (stock no. 72020, ACCO USA Inc., 770-S ACCO Plaza, Wheeling, Ill. 60090) were used to hold the aluminum coupon and quartz slide in place and the assembly with C-clamps still attached placed in a 76–80° C. vacuum oven for 22 hours causing the polymer to spread out as a clear, colorless layer, excess polymer extruding out the edges. The assembly was taken from the oven, cooled, the C-clamps removed, and the force required to pull the quartz slide away from the aluminum coupon measured in an Instron using a 3" jaw separation and a crosshead speed of 1"/minute. A force of 105.3 lbs was required. Separation occurred in the polymer layer, residual polymer being retained on both the aluminum and the quartz. A second similarly prepared sample required 101.0 pounds of force to pull apart for an average force of 103 lbs.

Example 10—VF2/PMVE

A 210 ml autoclave was loaded with 50 ml of $CF_2ClCCl_2F$, chilled to <−20° C., and 10 ml of ~0.2 M DP in $CF_3CFHCFHCF_2CF_3$ added. The autoclave was evacuated and loaded with 33 g perfluoro(methyl vinyl ether) (PMVE) and 13 g vinylidene fluoride (VF2). Shaking the autoclave overnight at room temperature gave solution that was evaporated down to soft polymer and then further dried for 29 hours under pump vacuum and for 20 hours in a 75° C. vacuum oven. This gave 31 g of soft polymer suitable for use as a glue.

| | | |
|---|---|---|
| Calc. for $(C_2H_2F_2)_{13}(C_3F_6O)_{10}$: | 26.98% C | 1.05% H |
| Found: | 27.21% C | 0.88% H |
| DSC, 10° C./min, nitrogen: | Tg = −29° C. (second heat) | |
| Inherent Viscosity, 2-heptanone: | 0.166 dL/g | |

Solution preparation and results: A solution was made by rolling 4 g of this polymer with 16 g of hexafluorobenzene. This solution was passed through a $0.45\mu$ glass microfiber syringe filter (Whatman, Autovial™) and the filtrate used to spin coat thick films on optical substrate for absorption measurements.

Solutions of 13:10 VF2:PMVE were spin coated onto $CaF_2$ substrates to produce polymer films of 25,970 angstroms thickness. VUV absorbance measurements were then used to determine the absorbance per micron.

The absorbance in units of inverse microns for 13:10 VF2:PMVE versus wavelength lambda (λ) in units of nanometers is shown in FIG. 16 for Sample 20. The 157 nm absorbance/micron determined is 0.034/micron. The 193 nm absorbance/micron determined is 0.015/micron. The 248 nm absorbance/micron determined is 0.018/micron.

Example 11—VF2/PPVE

A. Polymerization of Vinylidene Fluoride (VF2) with Perfluoro(propyl Vinyl Ether) (PPVE). A 210 ml autoclave was loaded with 50 ml of $CF_2ClCCl_2F$, chilled to <−20° C., and 10 ml of ~0.2 M DP in $CF_3CFHCFHCF_2CF_3$ added. The autoclave was cooled evacuated and 13 g VF2 and 53 g PPVE added. After shaking overnight at ambient temperatures (22–26° C.), the autoclave was vented, and solution recovered. Excess solvent was evaporated under nitrogen and the polymer dried 72 hours under vacuum at room temperature and then for 28 hours at 75° C., 45 g.

| | |
|---|---|
| Elemental analysis, found: | 26.17% C; 0.88% H |
| Calculated $(C_2F_2H_2)_7(C_5F_{10}O)_5$: | 26.34% C; 0.79% H |
| DSC, 10° C./min, nitrogen: | Tg = −32° C. (second heat) |
| Inherent Viscosity, hexafluorobenzene, 25° C.: | 0.169 dL/g |

Solution preparation and results: A solution was made by rolling 4 g of this polymer with 16 g of hexafluorobenzene. This solution was passed through a 0.45μ glass microfiber syringe filter (Whatman, Autovial™) and the filtrate used to spin coat thick films on optical substrate for absorption measurements.

Solutions of 7:5 VF2:PPVE were spin coated onto $CaF_2$ substrates to produce polymer films of 29,874 angstroms thickness. VUV absorbance measurements were then used to determine the absorbance per micron.

The absorbance in units of inverse microns for 7:5 VF2:PPVE versus wavelength lambda (λ) in units of nanometers is shown in FIG. 15 for Sample 21. The 157 nm absorbance/micron determined is 0.028/micron. The 193 nm absorbance/micron determined is −0.003/micron. The 248 nm absorbance/micron determined is −0.00074/micron.

B. Use as a Glue for a Pellicle Polymer. Poly(HFIB/VF) was prepared as a polymer film by dissolving 10 g of poly(HFIB/VF) (Example 8A above) in 40 g of 2-heptanone, adding 1 g of decolorizing carbon+1 g of chromatographic alumina+1 g of silica gel, filtering through an 0.45μ PTFE syringe filter, casting on Teflon™ FEP sheet with a 5 mil casting knife, and air drying. The poly(HFIB/VF) film prepared in this fashion could be lifted off the Teflon™ FEP sheet as clear, colorless film roughly 0.5 to 1 mil thick.

Glue solution was prepared next. Solution was made by dissolving 0.1 g of the poly(VF2/PPVE) prepared above in 1 g of hexafluorobenzene.

This glue solution was used to make a ~½" spot on an aluminum coupon measuring 1" wide by 3" long by 122 mil thick. This glue spot was air dried for 39 minutes and then the coupon was placed in a 62° C. oven under nitrogen for 13 minutes. As soon as the aluminum coupon was withdrawn hot from the oven, a poly(HFIB/VF) film sample was pressed down on top of the poly(VF2/PPVE) deposit with light finger pressure. Once, the aluminum coupon returned to room temperature, the poly(HFIB/VF) film tore when either pulled as in a lap shear or peeled back. The adhesive bond between the glue polymer [poly(VF2/PPVE)] and the pellicle polymer [poly(HFIB/VF)] was quite strong, exceeding the strength of the pellicle polymer.

Example 12—VF2/HFP

A. Poly(vinylidene fluoride/hexafluoropropylene) (VF2/HFP) Sample. A vinylidene fluoride/hexafluoropropylene sample made by the method of U.S. Pat. No. 4,985,520 of Jan. 15, 1991 was characterized.
Composition by Fluorine NMR in Deuteroacetone: 21 mole % VF2, 79 mole % HFP

| | |
|---|---|
| DSC, 10° C./min, nitrogen: | Tg = −22.5° C. (second heat) |
| Inherent Viscosity, acetone, 25° C.: | 0.753 dL/g |

Solution preparation and results: A solution was made by rolling 3 g of poly(VF2/HFP) with 17 g of 2-heptanone and filtering through a 0.45μ glass microfiber syringe filter (Whatman, Autovial™). The filtrate used to spin coat thick films on optical substrate for absorption measurements.

Solutions of 79:21 VF2:HFP were spin coated onto $CaF_2$ substrates to produce polymer films of 13,000 angstroms thickness. VUV absorbance measurements were then used to determine the absorbance per micron.

The absorbance in units of inverse microns for 79:21 VF2:HFP versus wavelength lambda (λ) in units of nanometers is shown in FIG. 15 for Sample 22. The 157 nm absorbance/micron determined is 0.014/micron. The 193 nm absorbance/micron determined is −0.002/micron. The 248 nm absorbance/micron determined is −0.00056/micron.

B. Use as a Glue for Quartz and Aluminum. An aluminum coupon measuring 1" wide by 3" long by 122 mil thick and a quartz slide measuring 1" wide by 3" long by 65 mil thick were both rinsed with $CF_2ClCCl_2F$ and air dried.

About 0.2 g of the poly(VF2/HFP) was chopped into 3 to 4 small pieces and placed on one end of the aluminum coupon. A quartz slide was pressed down on top so that the last inch of the quartz slide overlapped with the last inch of the aluminum coupon. Two C-clamps (stock #72020, ACCO USA Inc., 770-S ACCO Plaza, Wheeling, Ill. 60090) were used to hold the aluminum coupon and quartz slide in place and the assembly with C-clamps still attached placed in a 76–80° C. vacuum oven for 22 hours causing the polymer to spread out as a clear, colorless layer. The assembly was taken from the oven, cooled, the C-clamps removed, and the force required to pull the quartz slide away from the aluminum coupon measured in an Instron using a 3" jaw separation and a crosshead speed of 1"/minute. A force of 133.3 lbs was required. A second similarly prepared sample required 121.6 pounds of force to pull apart for an average force of 127 lbs. In second of the two experiments the separation occurred in the polymer layer, residual polymer being retained on both the aluminum and the quartz. In the first of the two experiments the separation occurred between the polymer and the glass. In either event, residual polymer could be pulled cleanly off the glass and the aluminum as a single piece.

C. Use as a Glue for a Pellicle Polymer. Poly(HFIB/VF) was prepared as a polymer film by dissolving 10 g of poly(HFIB/VF) (Example 2A above) in 40 g of 2-heptanone, adding 1 g of decolorizing carbon+1 g of chromatographic alumina+1 g of silica gel, filtering through an 0.45μ PTFE syringe filter, casting on Teflon™ FEP sheet with a 5 mil casting knife, and air drying. The poly(HFIB/VF) film prepared in this fashion could be lifted off the Teflon™ FEP sheet as clear, colorless film roughly 0.5 to 1 mil thick.

Glue solution was prepared next. Solution was made by dissolving 0.1 g of the poly(VF2/HFP) prepared above in 1 g of hexafluorobenzene.

This glue solution was used to make a ~½" spot on an aluminum coupon measuring 1" wide by 3" long by 122 mil thick. This glue spot was air dried for 39 minutes and then the coupon was placed in a 62° C. nitrogen blanketed oven for 13 minutes. As soon as the aluminum coupon was withdrawn hot from the oven, a poly(HFIB/VF) film sample was pressed down on top of the poly(VF2/HFP) deposit with light finger pressure. Once, the aluminum coupon returned to room temperature, the poly(HFIB/VF) film tore when pulled as in a lap shear. When the poly(HFIB/F) film was peeled back on itself, adhesive failure occurred between the poly(VF2/HFP) glue and the aluminum, the poly(VF2/HFP) adhesive layer coming away clean from the aluminum and showing no debonding from the poly(HFIB/VF). This shows excellent adhesion between the pellicle polymer [poly(HFIB/VF)] and the glue polymer [poly(VF2/HFP)].

Example 13—HFP/PMVE/VF2

A 210 ml Hastelloy C autoclave was chilled to <−20° C. and loaded with 20 ml of ~0.17 M DP in $CF_3CFHCFHCF_2CF_3$ added. The autoclave was evacuated and loaded with 33 g perfluoro(methyl vinyl ether) (PMVE), 26 g vinylidene fluoride (VF2), 26 g of hexafluoropropylene (HFP), and 1 g of anhydrous hydrogen chloride (chain transfer agent). Shaking the autoclave overnight at room temperature gave colorless oil that was devolatilized for 24 hours in air, 19 hours under pump vacuum, and then for five days in a 75° C. vacuum oven, giving 47 g of clear, tacky resin suitable for use as a glue.

| | |
|---|---|
| Composition by Fluorine NMR: | 63 mole % VF2 |
| | 27 mole % PMVE |
| | 10 mole % HFP |
| Inherent viscosity, acetone, 25° C.: | 0.120 dL/g |

Solution preparation and results: A solution was made by rolling 4 g of this polymer with 12 g of 2-heptanone to give a hazy solution. This solution was passed through a $0.45\mu$ glass microfiber and Teflon™ syringe filters (Whatman, Autovial™) and the filtrate used to spin coat thick films on optical substrate for absorption measurements.

Solutions of 10:27:63 HFP:PMVE:VF2 were spin coated onto $CaF_2$ substrates to produce polymer films of 316,500 angstroms thickness. VUV absorbance measurements were then used to determine the absorbance per micron.

The absorbance in units of inverse microns for 10:27:63 HFP:PMVE:VF2 versus wavelength lambda ($\lambda$) in units of nanometers is shown in FIG. 16 for Sample 23. The 157 nm absorbance/micron determined is 0.008/micron. The 193 nm absorbance/micron determined is −0.00048/micron. The 248 nm absorbance/micron determined is −0.00045/micron.

Example 14—HFIB/VF

An 85 ml autoclave was loaded with two ⅜" diameter stainless steel balls, sealed, evacuated, chilled to <−20° C., and 10 ml of ~0.17 M DP in $CF_3CFHCFHCF_2CF_3$ sucked in. The autoclave was further chilled and 70 g hexafluoroisobutylene (HFIB) added at ~−50° C. and 10 psig liquid vinyl fluoride (VF) added at ~−35° C. The now liquid full autoclave was shaken and allowed to warm to room temperature. Pressure in the clave maxed-out at 7780 psi at 25° C., finishing at 103 psig at 29° C. about 10 hours into the run. Drying the solid polymeric product for 72 hours under pump vacuum gave 57 g of white solid with a glass transition temperature of 115° C.

| | | |
|---|---|---|
| Calc. for $(HFIB)_{59}(VF)_{41}$: | 33.04% C | 2.11% H |
| | 33.02% C | 2.31% H |
| DSC, 10° C./min, nitrogen: | Tg = 115° C. (second heat) | |
| | Tm not detected (first or second heats) | |
| Inherent Viscosity, THF, 25° C.: | 0.183 dL/g | |

Solution preparation and results: A solution was made by rolling 12 g of this polymer with 48 g of 2-heptanone. This solution was passed through a $0.45\mu$ glass microfiber and Teflon™ syringe filters (Whatman, Autovial™) and the filtrate used to spin coat thick films on optical substrate for absorption measurements.

Solutions of 10:7 HFIB:VF were spin coated onto $CaF_2$ substrates to produce polymer films of 7500 angstroms thickness. VUV absorbance measurements were then used to determine the absorbance per micron.

The absorbance in units of inverse microns for 10:7 HFIB:VF versus wavelength lambda ($\lambda$) in units of nanometers is shown in FIG. 16 for Sample 24. The 157 nm absorbance/micron determined is −0.013/micron. The 193 nm absorbance/micron determined is −0.016/micron. The 248 nm absorbance/micron determined is −0.011/micron.

Sample 15—PDD/PMVE

A 75 ml autoclave was loaded with 25 ml of $CF_2ClCCl_2F$, chilled to <−20° C., and 10 ml of ~0.2 M DP in $CF_3CFHCFHCF_2CF_3$ and 11.6 ml of 4,5-difluoro-2,2-bis(trifluoromethyl)1,3-dioxole (PDD) added. The autoclave was evacuated and loaded with 4.5 g perfluoro(methyl vinyl ether) (PMVE). Shaking the autoclave overnight at room temperature gave a gelatinous product that was evaporated down and then further dried for 29 hours under pump vacuum and for 20 hours in a 75° C. vacuum oven. This gave 18 g of product.

| | |
|---|---|
| Calc. for $(PDD)_6(PMVE)_5$: | 23.56% C |
| Found: | 23.87% C |
| DSC, 10° C./min, nitrogen: | Tg = 133° C. |
| Inherent Viscosity, Fluorinert™ FC-40: | 0.161 dL/g |

Solution preparation and results: A hazy solution was made by rolling 4 g of this polymer with 16 g of Fluorinert™ FC-40. This solution was passed through a $0.45\mu$ glass microfiber syringe filter (Whatman, Autovial™) and then, after the addition of 0.6 g of chromatographic alumina and 0.6 g of chromatographic silica gel, through a $0.45\mu$ Teflon™ syringe filter (Whatman, Autovial™). The filtrate was used to spin coat thick films on optical substrate for absorption measurements.

Solutions of 6:5 PDD:PMVE were spin coated onto $CaF_2$ substrates to produce polymer films of 12,450 angstroms thickness. VUV absorbance measurements were then used to determine the absorbance per micron.

The absorbance in units of inverse microns for 6:5 PDD:PMVE versus wavelength lambda ($\lambda$) in units of nanometers is shown in FIG. 16 for Sample 25. The 157 nm absorbance/micron determined is 0.209/micron. The 193 nm absorbance/micron determined is 0.006/micron. The 248 nm absorbance/micron determined is 0.013/micron.

Example 16—VF/ClDFE

A 75 ml autoclave was loaded with 25 ml of $CF_2ClCCl_2F$, chilled to <−20° C., and 10 ml of ~0.17 M DP in $CF_3CFHCFHCF_2CF_3$ added. The autoclave was evacuated and loaded with 6.4 g of vinyl fluoride (VF) and 9.8 g 1-chloro-2,2-difluoroethylene (ClDFE). Shaking the autoclave overnight at room temperature gave damp paste that was dried for 4 days under pump vacuum and for 28 hours in a 75° C. vacuum oven. This gave 8 g of product.

| | | |
|---|---|---|
| Calc. for $(C_2H_3F)_{20}(C_2HF_2Cl)_{11}$: | 37.16% C | 3.57% H |
| Found: | 37.39% C | 3.30% H |
| DSC, 10° C./min, nitrogen: | Tg = 97° C. (first heat) | |
| | Tg not detected second heat | |
| Inherent Viscosity, acetone: | 0.220 dL/g | |

Solution preparation and results: A solution was made by rolling 4 g of this polymer with 16 g of heptanone. This solution was passed through a 0.45μ glass microfiber syringe filter (Whatman, Autovial™) and the filtrate used to spin coat thick films on optical substrate for absorption measurements.

Solutions of 20:11 VF:ClDFE were spin coated onto $CaF_2$ substrates to produce polymer films of 9461 angstroms thickness. VUV absorbance measurements were then used to determine the absorbance per micron.

The absorbance in units of inverse microns for 20:11 VF:ClDFE versus wavelength lambda (λ) in units of nanometers is shown in FIG. 17 for Sample 26. The 157 nm absorbance/micron determined is 0.226/micron. The 193 nm absorbance/micron determined is 0.036/micron. The 248 nm absorbance/micron determined is 0.003/micron.

Sample 27—PDD/VF2

A 75 ml autoclave was chilled to <−20° C. and loaded with 10 ml of $CF_3CFHCFHCF_2CF_3$, 5 ml of ~0.17 M DP in $CF_3CFHCFHCF_2CF_3$, and 20 g of 4,5-difluoro-2,2-bis(trifluoromethyl)-1,3-dioxole (PDD). The autoclave was evacuated and loaded with 13 g vinylidene fluoride (VF2). Shaking the autoclave overnight at room temperature gave viscous oil and that was devolatilized in air, 32 hours under pump vacuum, and then for 23 hours in a 75° C. vacuum oven, giving 16 g of white resin.

| | | |
|---|---|---|
| Calc. for $(PDD)_1(VF2)_2$: | 29.05% C | 1.08% H |
| Found: | 29.35% C | 1.08% H |
| DSC, 10° C./min, nitrogen: | 52° C. (weak) | |
| Inherent Viscosity, hexafluorobenzene, 25° C.: | 0.278 | |

Solution preparation and results: A solution was made by rolling 2 g of poly(PDD/VF2) with 8 g of 2-hexafluorobenzene. This solution was passed through a 0.45μ glass microfiber syringe filter (Whatman, Autovial™) and the filtrate used to spin coat thick films on optical substrate for absorption measurements.

Solutions of 1:2 PDD:VF2 were spin coated onto $CaF_2$ substrates to produce polymer films of 82,000 angstroms thickness. VUV absorbance measurements were then used to determine the absorbance per micron.

The absorbance in units of inverse microns for 1:2 PDD:VF2 versus wavelength lambda (λ) in units of nanometers is shown in FIG. 17 for Sample 27. The 157 nm absorbance/micron determined is 0.009/micron. The 193 nm absorbance/micron determined is 0.003/micron. The 248 nm absorbance/micron determined is −0.00030/micron.

Sample 28—PDD/VF2

A 75 ml autoclave was chilled to <−20° C. and loaded with 20 ml of $CF_3CFHCFHCF_2CF_3$, 5 ml of ~0.17 M DP in $CF_3CFHCFHCF_2CF_3$, and 20 g of 4,5-difluoro-2,2-bis(trifluoromethyl)-1,3-dioxole (PDD). The autoclave was evacuated and loaded with 6 g vinylidene fluoride (VF2). Shaking the autoclave overnight at room temperature gave viscous oil and that was devolatilized in air, 32 hours under pump vacuum, and then for 23 hours in a 75° C. vacuum oven, giving 16 g of white resin.

| | | |
|---|---|---|
| Calc. for $(C_5F_8O_2)_2(C_2H_2F_2)_1$: | 26.11% C | 0.37% H |
| Found: | 26.03% C | 0.53% H |
| DSC, 10° C./min, nitrogen: | 96° C.? (weak) | |
| Inherent Viscosity, hexafluorobenzene, 25° C.: | 0.671 | |

Solution preparation and results: A hazy solution was made by rolling 2 g of poly(PDD/VF2) with 18 g of 1H-perfluorohexane. This solution was passed through an 0.45μ glass microfiber syringe filter (Whatman, Autovial™) with the aid of a pad of chromatographic silica gel to help in the filtration, additional 2-H-perfluorohexane added to approximately replace that lost to evaporation, and then filtered again through an 0.45μ Teflon™ syringe filter (Whatman, Autovial™). The now clear filtrate was used to spin coat thick films on optical substrate for absorption measurements.

Sample 28—PDD/VF2

A Teflon™ coated 400 ml stainless steel autoclave chilled to <−20° C. was loaded with 90 ml of $CF_3CFHCFHCF_2CF_3$, 30 ml of ~0.1 M DP in $CF_3CFHCFHCF_2CF_3$, and 120 g of 4,5-difluoro-2,2-bis(trifluoromethyl)-1,3-dioxole. The autoclave was pressured to 100 psi with nitrogen and evacuated ten times. Finally 58 g of vinylidene fluoride (VF2) were added and the autoclave shaken overnight at room temperature. The resulting thick gel was dried under nitrogen, then under pump vacuum, and finally for 4 days in a 75° C. vacuum oven, giving 122 g of white resin.

| | | |
|---|---|---|
| Calc. for $(C_5F_8O_2)_5(C_2H_2F_2)_8$: | 28.42% C | 0.93% H |
| Found: | 28.22% C | 1.16% H |
| DSC, 10° C./min, nitrogen | 59° C. | |
| Inherent Viscosity, hexafluorobenzene, 25° C.: | 0.576 | |

Solution preparation: A solution was made by rolling 1.70 g of the poly(PDD/VF2) with 15.3 g of hexafluomobenzene. Filtration through a 0.45μ glass fiber microfiber syringe filter (Whatman Autovial™) gave clear, colorless solution. The filtrate was used to spin coat films on optical substrate for absorption measurements.

Solutions of 5:8 PDD:VF2 were spin coated onto $CaF_2$ substrates to produce polymer films of 38,298 angstroms thickness. VUV absorbance measurements were then used to determine the absorbance per micron.

The absorbance in units of inverse microns for 5:8 PDD:VF2 versus wavelength lambda (λ) in units of nanometers is shown in FIG. 19 for Sample 29. The 157 nm absorbance/micron determined is 0.018/micron. The 193 nm absorbance/micron determined is 0.010/micron. The 248 nm absorbance/micron determined is 0.000057/micron.

Example 19A—HFIB/VF2/VF

A 210 ml Hastelloy C autoclave was loaded with 50 ml of $CF_2ClCCl_2F$, chilled to <−20° C., and 15 ml of ~0.2 M DP in $CF_3CFHCFHCF_2CF_3$ added. The autoclave was evacuated and loaded with 32 g hexafluoroisobutylene (HFIB), 3 g vinylidene fluoride (VF2), and 7 g vinyl fluoride (VF). Shaking the autoclave overnight at room temperature gave a thick paste of white solids that was dried under nitrogen, for 70 hours under pump vacuum, and for 23 hours in a 75° C. vacuum oven. This gave 33 g of product having an analysis matching a range of possible stoichiometries.

| | | |
|---|---|---|
| Calc. for $(C_4H_2F_6)_3(C_2H_3F)_1(C_2H_2F_2)_1$: | 31.91% C | 1.84% H |
| Calc. for $(C_4H_2F_6)_5(C_2H_3F)_1(C_2H_2F_2)_3$: | 31.78% C | 1.81% H |
| Found: | 31.78% C | 1.88% H |
| DSC, 10° C./min, nitrogen: | Tg = 48° C. | |
| Inherent Viscosity, acetone, 25° C.: | 0.030 dL/g | |

Solution preparation and results: A hazy solution was made by rolling 8 g of this polymer with 20 g of heptanone. This solution was passed through a 0.45µ glass fiber syringe filter (Whatman, Autovial™), a 0.45µ Teflon™ syringe filter (Whatman, Autovial™), and a 0.45µ Teflon™ syringe filter (Whatman, Autovial™) with the aid of a 1 g pad of chromatographic alumina to aid in the filtration. The now clear filtrate was used to spin coat thick films on optical substrate for absorption measurements.

Example 19B—HFIB/VF/VF2

Table 2 Example Corresponding to FIG. 19/Sample 31)

A 400 ml autoclave was loaded with 200 ml deionized water, 0.05 g Vazo™ 56 WSP initiator, and pressured to 100 psi with nitrogen and evacuated ten times. The autoclave was chilled to <−20° C., evacuated, and further loaded with 82 g of hexafluoroisobutylene (HFIB), 13 g of vinylidene fluoride (VF2), and 14 g of vinyl fluoride (VF). The contents of the autoclave were shaken for ~64 hours at 50° C. The resulting mix of solids plus emulsion was frozen and thawed. Vacuum filtration and washing twice in the filter with 200 ml of water gave white fluffy solid with some darker yellow chunks that were removed. The remaining white fluff was washed twice more in the filter with 150 ml of methyl alcohol. Sucking the white fluff dry on the filter and then further drying for 5 days under pump vacuum gave 16 g of polymer. Composition by fluorine NMR: 41 mole % HFIB, 37 mole % VF, 22 mole % VF2

| | |
|---|---|
| DSC, 10° C./min, nitrogen | 71° C. |
| Inherent Viscosity, tetrahydrofuran, 25° C.: | 0.523 |

Solution preparation: A solution was made by rolling 3 g of poly(HFIBVF/VF2) with 17 g of 2-heptanone. Filtration through a 0.45µ glass fiber microfiber syringe filter and then through a 0.45µ PTFE syringe filter (Whatman Autovial™) gave a clear but faintly yellow solution. This filtrate was used to spin coat films on optical substrate for absorption measurements.

Solutions of 41:37:22 HFIB:VF:VF2 were spin coated onto $CaF_2$ substrates to produce polymer films of 5289 angstroms thickness. VUV absorbance measurements were then used to determine the absorbance per micron.

The absorbance in units of inverse microns for 41:37:22 HFIB:VF:VF2 versus wavelength lambda (λ) in units of nanometers is shown in FIG. 19 for Sample 31. The 157 nm absorbance/micron determined is 0.016/micron. The 193 nm absorbance/micron determined is −0.010/micron. The 248 nm absorbance/micron determined is −0.002/micron.

Sample 9—PDD/TrFE

A 75 ml autoclave was loaded with 40 ml water and 0.1 g of Vazo™ 56 WSP initiator. The autoclave was chilled to <−20° C. and 10 g of 4,5-difluoro-2,2-bis(trifluoromethyl)-1,3-dioxole (PDD) added. The autoclave was evacuated and 5 g of trifluoroethylene (TrFE) added. Shaking for 10 hours at 70° C. gave a lump of polymer that was separated and dried for 72 hours in a 75° C. vacuum oven, 9.9 g.

| | | |
|---|---|---|
| Elemental analysis, found: | 25.51% C | 0.55% H |
| Calculated $(C_5F_8O_2)_1(C_2F_3H)_1$: | 25.79 C | 0.31% H |
| DSC, 10° C./min, nitrogen: | Tg = 150° C.? | |
| | (weak, second heat) | |
| Inherent Viscosity, Hexafluorobenzene, 25° C.: | 1.3 dL/g | |

Solution preparation and results: A solution was made by rolling 1 g of the polymer with 33 g of Fluorinert™ Fc-75 and filtering through a 0.45µ glass microfiber syringe filter (Whatman, Autovial™). The filtrate was used to spin coat thick films on optical substrate for absorption measurements.

Solutions of 1:1 PDD:TrFE were spin coated onto $CaF_2$ substrates to produce polymer films of 7688 angstroms thickness. VUV absorbance measurements were then used to determine the absorbance per micron.

The absorbance in units of inverse microns for 1:1 PDD:TrFE versus wavelength lambda (λ) in units of nanometers is shown in FIG. 16 for Sample 9. The 157 nm absorbance/micron determined is 0.03/micron. The 193 nm absorbance/micron determined is −0.004/micron. The 248 nm absorbance/micron determined is −0.001/micron.

Example 21—CTFE/VF

A 75 ml autoclave was loaded with 25 ml of $CF_2ClCCl_2F$, chilled to <−20° C., and 5 ml of ~0.1 M DP in $CF_3CFHCFHCF_2CF_3$ added. The autoclave was evacuated and loaded with 17 g of chlorotrifluoroethylene (CTFE) and 7 g vinyl fluoride (VF). Shaking the autoclave overnight at room temperature gave a swollen gel that was dried in air, for 96 hours under pump vacuum, and for 25 hours in a 75° C. vacuum oven. This gave 18 g of polymer.

| | | | |
|---|---|---|---|
| Calc. for $(C_2F_3Cl)_1(C_2H_3F)_1$: | 29.56% C | 1.86% H | 21.82% Cl |
| Found: | 29.74% C | 1.83% H | 21.80% Cl |
| DSC, 10° C./min, nitrogen: | Tg = 86° C. (first heat) | | |
| Inherent Viscosity, acetone, 25° C.: | 1.08 dL/g | | |

Solution preparation and results: A solution was made by rolling 2 g of this polymer with 15 g of heptanone. This solution was passed through a 0.45µ glass fiber syringe filter (Whatman, Autovial™) and the filtrate used to spin coat thick films on optical substrate for absorption measurements.

Solutions of 1:1 CTFE:VF were spin coated onto $CaF_2$ substrates to produce polymer films of 1850 angstroms thickness and 17,644 angstroms thickness. VUV absorbance measurements were then used to determine the absorbance per micron.

The absorbance in units of inverse microns for 1:1 CTFE:VF versus wavelength lambda (λ) in units of nanometers is shown in FIG. 18 for Sample 6b. The 157 nm absorbance/micron determined from the thicker film is 0.388/micron. The 193 nm absorbance/micron determined from the thicker film is 0.016/micron. The 248 nm absorbance/micron determined from the thicker film is 0.006/micron.

Example 22—VF2/TrFE

A 75 ml autoclave was loaded with 25 ml of $CF_2ClCCl_2F$, chilled to <−20° C., and 5 ml of ~0.1 M DP in CF$_3$CFHCFHCF$_2$CF$_3$ added. The autoclave was evacuated and loaded with 9.6 g of vinylidene fluoride (VF2) and 12 g trifluoroethylene (TrFE). Shaking the autoclave overnight at room temperature gave a damp white solid that was dried under pump vacuum and then 24 hours in a 75° C. vacuum oven. This gave 14 g of polymer.

| | | |
|---|---|---|
| Calc. for (C$_2$H$_3$F$_2$)$_5$(C$_2$F$_3$H)$_2$: | 34.73% C | 2.50% H |
| Found: | 34.78% C | 2.48% H |
| DSC, 10° C./min, nitrogen: | first heat, Tg = 55° C. | |
| | second heat, Tg = 98 and 147° C. | |
| Inherent Viscosity, acetone, 25° C.: | 1.087 dL/g | |

Solution preparation and results: A solution was made by rolling 3.11 g of this polymer with 34.32 g of 1-methoxy-2-propanol acetate. The resulting hazy solution with particulates passed with difficulty through an 0.45$\mu$ glass fiber syringe filter (Whatman, Autovial™). Evaporation of 2.82 g of this solution gave 0.220 g of residue (7.8 wt % solids vs. 8.3% expected if no solids eliminated by filtration). Thick films were spin coated on optical substrate for absorption measurements.

Solutions of 5:2 VF2:TrFE were spin coated onto CaF$_2$ substrates to produce polymer films of 4500 angstroms thickness. VUV absorbance measurements were then used to determine the absorbance per micron.

The absorbance in units of inverse microns for 5:2 VF2:TrFE versus wavelength lambda ($\lambda$) in units of nanometers is shown in FIG. 18 for Sample 10. The 157 nm absorbance/micron determined is 0.924/micron. The 193 nm absorbance/micron determined is 0.188/micron. The 248 nm absorbance/micron determined is 0.083/micron.

Example 23—HFIB/VOH

A. Hexafluoroisobutylene (HFIB)/Vinyl Acetate (VOAc) Copolymer. A 400 ml autoclave was loaded with 50 ml of CF$_2$ClCCl$_2$F, 27 ml of vinyl acetate, and 50 ml of ~0.1M DP in CF$_3$CFHCFHCF$_2$CF$_3$. The autoclave was chilled, evacuated, and further loaded with 49 g of HFIB. Shaking overnight at room temperature gave a viscous pale yellow solution. The polymer was precipitated by addition to 400 ml of methyl alcohol. Filtration, drying under pump vacuum, and drying for 19 hours in a 75° C. vacuum oven gave 52 g of poly(HFIB/VOAc) having an inherent viscosity of 0.13 in acetone at 25° C.

B. Hexafluoroisobutylene (HFIB)/Vinyl Alcohol (VOH) Copolymer. Fifty grams of the poly(HFIB/VOAc) prepared above, 500 ml of methyl alcohol, and 25 ml of 25 wt % sodium methoxide in methyl alcohol were refluxed for 6 hours. Over this period additional methyl alcohol was added as ~860 ml of methyl alcohol were distilled off. Addition of resulting polymer solution to water gave a gummy precipitate. The water was decanted off and the precipitate taken back into 200 ml of methyl alcohol and reprecipitated with 500 ml of water in a Waring blender. Vacuum filtration, drying under pump vacuum and then for 24 hours in a 75° C. vacuum oven gave 37 g of poly(HFIB/VOH) as off white granules.

| | | |
|---|---|---|
| Calc. for (C$_4$H$_2$F$_6$)$_1$(C$_2$H$_4$O)$_1$: | 34.63% C | 2.91% H |
| Found: | 34.34% C | 2.73% H |
| DSC, 10° C./min, nitrogen: | Tg = 90° C. (second heat) | |

Solution preparation and results: A solution was made by rolling 3.28 g of this polymer with 34.91 g of 1-methoxy-2-propanol acetate. This solution was passed through a 0.45$\mu$ glass fiber syringe filter (Whatman, Autovial™) giving a slightly hazy pale yellow solution. The solution was treated with 0.4 g decolorizing carbon and filtered again and then with 0.58 g of silica gel and filtered a third time. The solution was still pale yellow but no longer hazy. The filtrate used to spin coat thick films on optical substrate for absorption measurements.

Solutions of 1:1 HFIB:VA were spin coated onto CaF$_2$ substrates to produce polymer films of 1350 angstroms thickness. VUV absorbance measurements were then used to determine the absorbance per micron.

The absorbance in units of inverse microns for 1:1 HFIB:VA versus wavelength lambda ($\lambda$) in units of nanometers is shown in FIG. 17 for Sample 32. The 157 nm absorbance/micron determined is 0.350/micron. The 193 nm absorbance/micron determined is 40.047/micron. The 248 nm absorbance/micron determined is −0.107/micron.

Sample 12—HFP/TrFE

A 75 ml autoclave was loaded with 25 ml of CF$_2$ClCCl$_2$F, chilled to <−20° C., and 5 ml of ~0.17 M DP in CF$_3$CFHCFHCF$_2$CF$_3$ added. The autoclave was evacuated and loaded with 12 g hexafluoropropylene (HFP) and 12 g of trifluoroethylene (TrFE). Shaking the autoclave overnight at room temperature gave a damp white solid that was dried for 22 hours under pump vacuum and for 24 hours in a 75° C. vacuum oven. This gave 12 g of product.

| | |
|---|---|
| Composition by Fluorine NMR: | 2 mole % HFP, 98 mole % TrFE |
| DSC, 10° C./min, nitrogen: | Tm = 179° C., Tg not detected |
| Inherent Viscosity, acetone, 25° C.: | 0.912 dL/g |

Solution preparation: Rolling 2.5 g of poly(HFP/TrFE) with 50 ml of propylene glycol methyl ether acetate gave a hazy solution Filtration though an 0.45$\mu$ PTFE syringe filter (Whatman, Autovial™) gave clear filtrate. The filtrate was used to spin coat thick films on optical substrate for absorption measurements.

Solutions of 2:98 HFP:TrFE were spin coated onto CaF$_2$ substrates to produce polymer films of 1389 angstroms thickness. VUV absorbance measurements were then used to determine the absorbance per micron.

The absorbance in units of inverse microns for HFP:TrFE versus wavelength lambda ($\lambda$) in units of nanometers is shown in FIG. 8 for Sample 12. The 157 nm absorbance/micron determined is 1.37/micron. The 193 nm absorbance/micron determined is 0.143/micron. The 248 nm absorbance/micron determined is −0.02/micron.

Sample 14—HFP/TFE

Hexafluoropropylene(HFP)/tetrafluoroethylene(TFE) copolymer was prepared by the method of U.S. Pat. No. 5,478,905 of Dec. 26, 1995. This polymer was 60 wt % HFP, 40 wt % TFE, and had an inherent viscosity of 0.407 dL/g (in Fluorinert™ FC-75 solvent at 25° C.).

Solution preparation: Rolling 31.6 g of HFP/TFE copolymer with 986 g of PF-5080 (Performance Fluid manufactured by 3M, believed to be largely perfluorooctanes) gave solution. Vacuum filtration through an 0.45$\mu$ filter gave clear solution. The filtrate was used to spin coat thick films on optical substrate for absorption measurements.

Solutions of 1:1 HFP:TFE were spin coated onto CaF$_2$ substrates to produce polymer films of 1850 angstroms thickness. VUV absorbance measurements were then used to determine the absorbance per micron.

The absorbance in units of inverse microns for 1:1 HFP:TFE versus wavelength lambda (λ) in units of nanometers is shown in FIG. 8 for Sample 14. The 157 nm absorbance/micron determined is 3.9/micron. The 193 nm absorbance/micron determined is 0.086/micron. The 248 nm absorbance/micron determined is 0.073/micron.

Example 26—VF2/CTFE

A 75 ml autoclave chilled to <−20° C. was loaded with 25 ml of $CF_2ClCCl_2F$ and 5 ml of ~0.1 M DP in $CF_3CFHCFHCF_2CF_3$. The autoclave was evacuated and loaded with 9.6 g of vinylidene fluoride (VF2) and 17 g of chlorotrifluoroethylene (CTFE). Shaking the autoclave overnight at room temperature gave viscous white fluid that was evaporated down to stretchy solid and then dried for 1 hour under pump vacuum and for 30 hours in a 75° C. vacuum oven. This gave 19 g of product.

| | | | |
|---|---|---|---|
| Calc $(C_2F_2H_2)_5(C_2F_3Cl)_4$: | 27.50% C | 1.28% H | 18.04% Cl |
| Found: | 27.26% C | 1.41% H | 17.91% Cl |
| DSC, 10° C./min, nitrogen: | Tg = 99° C. | | |
| Inherent Viscosity, acetone, 25° C.: | 0.546 dL/g | | |

Solution preparation: Rolling 3 g poly(VF2/CTFE) with 20 g of 2-heptanone gave solution that was filtered though an 0.45μ glass fiber syringe filter (Whatman, Autovial™). The filtrate was used to spin coat thick films on optical substrate for absorption measurements.

Solutions of 5:4 VF2:CTFE were spin coated onto $CaF_2$ substrates to produce polymer films. VUV absorbance measurements were then used to determine the absorbance per micron.

The absorbance in units of inverse microns for 5:4 VF2:CTFE versus wavelength lambda (λ) in units of nanometers is shown in FIG. 18 for Sample 15. The 157 nm absorbance/micron determined is 5.6/micron. The 193 nm absorbance/micron determined is 0.27/micron. The 248 nm absorbance/micron determined is 0.12/micron.

Example 27—PMD/TFE

A 75 ml autoclave chilled to <−20° C. was loaded with 5 ml of ~0.14 M DP in $CF_3CFHCFHCF_2CF_3$, 25 ml of $CF_3CFHCFHCF_2CF_3$, and 11.6 ml of perfluoro(2-methylene-4-methyl-1,3-dioxolane) (PMD). The tube was evacuated and further loaded with 5 g of tetrafluoroethylene (TFE). Shaking overnight at room temperature gave a milky, viscous oil. Evaporation under nitrogen, 76 hours under pump vacuum, and 24 hours in a 75° C. vacuum oven gave 20 g of resin assumed to be a ~2:1 copolymer of PMD:TFE (monomers mixed in ~2PMD:1TFE ratio).

| | |
|---|---|
| DSC, 10° C./min, nitrogen: | Tg not detected |
| Inherent Viscosity, Fluorinert™ FC-75, 25° C.: | 0.142 dL/g |

Solution preparation: Rolling 2.14 g of poly(PMD/TFE) with 26.2 g of Fluorinert™ FC-40 gave a hazy solution that was passed through an 0.45μ glass fiber filter (Whatman, Autovial™), through an 0.45μ glass fiber syringe filter (Whatman, Autovial™) after mixing with 0.2 g chromatographic silica+0.2 g of decolorizing carbon, and finally through an 0.45μ PTFE syringe filter (Whatman, Autovial™). The filtrate was used to spin coat thick films on optical substrate for absorption measurements.

Solutions of 1:1 PMD:TFE were spin coated onto $CaF_2$ substrates to produce polymer films of 2207 angstroms thickness. VUV absorbance measurements were then used to determine the absorbance per micron.

The absorbance in units of inverse microns for 1:1 PMD:TFE versus wavelength lambda (λ) in units of nanometers is shown in FIG. 18 for Sample 16. The 157 nm absorbance/micron determined is 1.17/micron. The 193 nm absorbance/micron determined is −0.015/micron. The 248 nm absorbance/micron determined is 0.07/micron.

Example 28—PMD

A 1 ounce glass sample vial equipped with rubber septum was flushed with nitrogen, chilled on dry ice, and then 3 ml of perfluoro(2-methylene-4-methyl-1,3-dioxolane) and 0.5 ml of ~0.17 M DP in $CF_3CFHCFHCF_2CF_3$ injected. The vial was set in water ice and allowed to warm slowly to room temperature over the next several hours with magnetic stirring. After ~62 hours at room temperature the contents of the vial, a stiff foam, were dried under pump vacuum and then for 17 hours in a 150° C. vacuum oven, giving 4.1 g of white fines after crushing with a spatula.

| | |
|---|---|
| DSC, 10° C./min, nitrogen: | Tg = 135° C. |
| Inherent Viscosity, hexafluorobenzene | 25° C. = 0.155 dL/g |

Solution preparation: Rolling 2 g of poly(PMD) with 18 g hexafluorobenezene gave a solution that was filtered through an 0.45μ glass fiber syringe filter (Whatman, Autovial™). The filtrate was used to spin coat thick films on optical substrate for absorption measurements.

Solutions of PMD were spin coated onto $CaF_2$ substrates to produce polymer films of 14,818 angstroms thickness. VUV absorbance measurements were then used to determine the absorbance per micron.

The absorbance in units of inverse microns for PMD versus wavelength lambda (λ) in units of nanometers is shown in FIG. 17 for Sample 33. The 157 nm absorbance/micron determined is 0.603/micron. The 193 nm absorbance/micron determined is −0.0007/micron. The 248 nm absorbance/micron determined is −0.0001/micron.

Example 29—PMD/PDDA 1 ounce glass sample vial equipped with rubber septum was flushed with nitrogen, chilled on dry ice, and then 3 ml of perfluoro(2-methylene-4-methyl-1,3-dioxolane) (PMD), 3 ml of 4,5-difluoro-2,2-bis(trifluoromethyl-1,3-dioxole (PDD) and 0.5 ml of ~0.17 M DP in $CF_3CFHCFHCF_2CF_3$ injected. The vial was set in water ice and allowed to warm slowly to room temperature over the next several hours with magnetic stirring. After 2 hours at room temperature the contents of the vial, a stiff foam, were dried under pump vacuum and then for 17 hours in a 150° C. vacuum oven, giving 8.6 g of white fines after crushing with a spatula.

Solution preparation: Rolling 2 g of poly(PMD/PDD) with 18 g hexafluorobenzene gave a somewhat gelatinous partial solution that was passed through a ~⅛th inch deep pad of chromatographic silica gel in an 0.45μ glass fiber syringe filter (Whatman, Autovial™). A portion of this solution was sent for $^{19}$F NMR which found the composition of the dissolved polymer to be 50 mole % PMD and 50 mole % PDD. The remaining filtrate was used to spin coat thick films on optical substrate for absorption measurements.

Solutions of PMD:PDD were spin coated onto CaF$_2$ substrates to produce polymer films of 12,762 angstroms thickness. VUV absorbance measurements were then used to determine the absorbance per micron.

The absorbance in units of inverse microns for PMD:PDD versus wavelength lambda (λ) in units of nanometers is shown in FIG. 17 for Sample 34. The 157 nm absorbance/micron determined is 0.404/micron. The 193 nm absorbance/micron determined is 0.006/micron. The 248 nm absorbance/micron determined is −0.002/micron.

Example 30—PMD/VF2

A 75 ml autoclave chilled to <−20° C. was loaded with 5 ml of ~0.17 M DP in CF$_3$CFHCFHCF$_2$CF$_3$, 15 ml of CF$_3$CFHCFHCF$_2$CF$_3$, and 11.6 ml of perfluoro(2-methylene-4-methyl-1,3-dioxolane) (PMD). The autoclave was pressured with 100 psi of nitrogen and evacuated ten times and then further loaded with 9.6 g of vinylidene fluoride (VF2). Shaking overnight at room temperature gave white solid. Evaporation under nitrogen, 16 hours under pump vacuum, and 32 hours in a 77° C. vacuum oven gave 23 g of resin.

| | | |
|---|---|---|
| Calc. (C$_5$F$_8$O$_2$)$_1$(C$_2$H$_2$F$_2$)$_2$: | 29.05% C | 1.08% H |
| Found: | 28.71% C | 1.38% H |

Solution preparation: Rolling 1 g of poly(PMD/FTE) with 19 g of hexafluorobenzene gave partial solution that was passed through a ~¼" deep pad of chromatographic silica in an 0.45μ glass fiber filter (Whatman, Autovial™). A portion of this solution was sent for $^{19}$F NMR which found the composition of the dissolved polymer to be 54 mole % PMD and 46 mole % vinylidene fluoride. The remaining filtrate was used to spin coat thick films on optical substrate for absorption measurements.

Sample 11—PDD:CTFE

Poly(4,5-difluoro-2,2-bis(trifluoromethyl)-1,3-dioxole/chlorotrifluoroethylene), poly(PDD/CTFE), has been reported many times in the literature as for example in U.S. Pat. No. 4,754,009. The poly(PDD/CTFE) used here was prepared by aqueous emulsion polymerization.

| | | |
|---|---|---|
| Calc. (C$_5$F$_8$O$_2$)$_{10}$(C$_2$F$_3$Cl)$_{23}$ | 22.52% C | 15.93% Cl |
| Found | 22.41% C | 15.94% Cl |

Solution preparation: Rolling 2.5 g of poly(PDD/CTFE) with 30 ml of hexafluorobenzene gave a pale yellow solution that was passed through an 0.45μ glass fiber filter (Whatman, Autovial™). Because this solution was too viscous to easily spin coat, 11.2 g of this solution was diluted down with another 10.1 of hexafluorobenzene. This diluted solution was used to spin coat thick films on optical substrate for absorption measurements.

Solutions of 10:23 PDD:CTFE were spin coated onto CaF$_2$ substrates to produce polymer films of 1903 angstroms thickness. VUV absorbance measurements were then used to determine the absorbance per micron.

The absorbance in units of inverse microns for 10:23 PDD:CTFE versus wavelength lambda (λ) in units of nanometers is shown in FIG. 18 for Sample 11. The 157 nm absorbance/micron determined is 1.44/micron. The 193 nm absorbance/micron determined is 0.018/micron. The 248 nm absorbance/micron determined is 0.046/micron.

What is claimed is:

1. An ultraviolet transparent material exhibiting an absorbance/micron (A/micrometer) ≦1 at wavelengths from 187–260 nm comprising: amorphous vinyl copolymers of CX$_2$=CH$_2$, wherein X is —F or —CF$_3$ and up to 25 mole % of one or more monomers CR$^a$R$^b$=CR$^c$R$^d$ where the CR$^a$R$^b$=CR$^c$R$^d$ enters the copolymer in approximately random fashion or 40 to 60 mole % of one or more monomers CR$^a$R$^b$=CR$^c$R$^d$ in the case where the CR$^a$R$^b$=CR$^c$R$^d$ enters the copolymer in approximately alternating fashion where each of R$^a$, R$^b$, and R$^c$ is selected independently from H or F and where R$^d$ is selected from the group consisting of —F, —CF$_3$, —OR$_f$ where R$_f$ is C$_n$F$_{2n+1}$ with n=1 to 3, —OH (when R$^c$=H), and Cl (when R$^a$, R$^b$, and R$^c$=F), with the proviso that not all of R$^{a-d}$ can be F.

2. An ultraviolet transparent material exhibiting an absorbance/micron (A/micrometer) ≦1 at wavelengths from 187–260 nm comprising amorphous vinyl copolymers selected from the noun consisting of CH$_2$=CHCF$_3$ and CF$_2$=CF$_2$; CH$_2$=CFH and CF$_2$=CFCl; CH$_2$=CHF and CClH=CF$_2$, wherein the molar ratio of monomers ranges from approximately 1:2 to approximately 2:1; perfluoro(2-methylene-4-methyl-1,3-dioxolane) and perfluoro(2,2-dimethyl-1,3-dioxole); perfluoro(2-methylene-4-methyl-1,3-dioxolane) and vinylidene fluoride in any ratio that gives an amorphous composition; perfluoro(2-methylene-4-methyl-1,3-dioxolane) with tetrafluoroethylene in any ratio that gives an amorphous composition; and the homopolymer of perfluoro(2-methylene-4-methyl-1,3-dioxolane).

3. The UV transparent material of claims 1 or 2 wherein the transparent material exhibits A/micrometer ≦0.8 at wavelengths from 187–260 nm.

4. The UV transparent material of claim 3 wherein the UV transparent material exhibits A/micrometer ≦0.2 at wavelengths from 187–260 nm.

5. The UV transparent material of claim 4 wherein the V transparent material exhibits A/micrometer ≦0.1 at wavelengths from 187–260 nm.

6. The UV transparent material of claim 1 wherein the polymer is an approximately alternating copolymer having 40–60 mole % CX$_2$=CH$_2$ where X is —F or —CF$_3$, and having 60 to 40 mole % monomers of the structure CR$^a$R$^b$=CR$^c$R$^d$ where each of R$^a$, R$^b$, and R$^c$ is selected independently from H or F and where R$^d$ is selected from the group consisting of —F, —CF$_3$, —OR$_f$ where R$_f$ is C$_n$F$_{2n+1}$ with n=1 to 3, —OH (when R$^c$=H), and Cl (when R$^a$, R$^b$, and R$^c$=F), with the proviso that not all of R$^{a-d}$ can be F.

7. The UV transparent material of claim 6 wherein the copolymer is a hexafluoroisobutylene/trifluoroethylene copolymer wherein the molar ratio of the monomers is from approximately 60:40 to approximately 40:60.

8. The UV transparent material of claim 6 wherein the copolymer is a hexafluoroisobulylene/vinyl fluoride copolymer wherein the molar ratio of monomers is from approximately 60:40 to approximately 40:60.

9. The UV transparent material of claim 1 wherein the copolymer is an approximately random copolymer having >75 mole % CX$_2$=CY$_2$ where X is —F or —CF$_3$, and Y is H, and having <25 mole % monomers of the structure CR$^a$R$^b$=CR$^c$R$^d$ where each of R$^a$, R$^b$, and R$^c$ is selected independently from H or F and where R$^d$ is selected from the group consisting of —F, —CF$_3$, —OR$_f$ where R$_f$ is C$_n$F$_{2n+1}$ with n=1 to 3, —OH (when R$^c$=H), and Cl (when R$^a$, R$^b$, and R$^c$=F), with the proviso that not all of R$^{a-d}$ can be F.

10. The UV transparent material of claim 9 where the copolymer is >75 mole % vinylidene fluoride and <25 mole % hexafluoropropylene.

11. The UV transparent material of claim 9 wherein the copolymer is 60–40 mole % vinyl fluoride and 40–60 mole % chlorotrifluroethylene.

12. Pellicles comprising the UV transparent material of claims 1 or 2.

13. Anti-reflective coatings comprising the UV transparent material of claims 1 or 2.

14. Optically clear glues comprising the UV transparent material of claims 1 or 2.

15. Light guides comprising the UV transparent material of claims 1 or 2.

16. Resists comprising the UV transparent material of claims 1 or 2.

17. The resists of claim 16 further comprising solubility responsive monomers.

18. Transmissive optical elements comprising the UV transparent material of claims 1 or 2.

19. A copolymer composition comprising poly(hexafluoroisobutylene:trifluoroethylene) with 40–60 mole % hexafluoroisobutylene and 60–40 mole % trifluoroethylene having A/micron <1 at 187–260 nm.

20. An amorphous copolymer composition comprising poly(hexafluoroisobutylene:vinyl fluoride) with 40–60 mole % hexafluoroisobutylene and 60–40 mole % vinyl fluoride having A/micron <1 at 187–260 nm.

21. A copolymer composition of claim 19 or 20 having A/micron <0.8 at 187–260 nm.

22. A copolymer composition of claim 21 having A/micron <0.2 at 187–260 nm.

23. A copolymer composition of claim 22 having A/micron <0.1 at 187–260 nm.

24. The ultraviolet transparent material of claim 1 wherein X is F.

25. The use of the polymer of claim 10 as an adhesive.

26. The use of the polymer of claim 10 as an adhesive in attaching a pellicle to a photomask.

27. The use of the polymer of claim 10 as an adhesive in attaching a pellicle to a frame.

28. The material of claim 1 or claim 2 wherein the wavelength is 187 to 199 nm.

* * * * *